(12) United States Patent
Hsu et al.

(10) Patent No.: US 7,138,685 B2
(45) Date of Patent: Nov. 21, 2006

(54) VERTICAL MOSFET SRAM CELL

(75) Inventors: Louis L. Hsu, Fishkill, NY (US); Oleg Gluschenkov, Wappingers Falls, NY (US); Jack A. Mandelman, Flat Rock, NC (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 10/318,495

(22) Filed: Dec. 11, 2002

(65) Prior Publication Data

US 2004/0113207 A1    Jun. 17, 2004

(51) Int. Cl.
*H01L 21/00* (2006.01)
(52) U.S. Cl. .................. 257/368; 257/379; 327/51; 327/55
(58) Field of Classification Search ............. 257/368, 257/393, 350, 369, 377, 900, 903, 329, 67, 257/69, 379; 438/153, 154; 327/51, 55, 327/57, 52
See application file for complete search history.

(56) References Cited

U.S. PATENT DOCUMENTS 5,130,777 A * 7/1992 Galbraith et al. .......... 257/530
5,909,618 A   6/1999 Forbes et al.
6,133,608 A   10/2000 Flaker et al.
6,140,684 A * 10/2000 Chan et al. ................. 257/368
6,201,428 B1 * 3/2001 Clark ......................... 327/333
6,271,063 B1 * 8/2001 Chan et al. ................. 438/153
6,477,080 B1   11/2002 Noble
6,569,723 B1 * 5/2003 Liaw ........................... 438/153
6,867,460 B1 * 3/2005 Anderson et al. ........... 257/351
2004/0113207 A1 * 6/2004 Hsu et al. .................... 257/368

* cited by examiner

*Primary Examiner*—Laura M. Schillinger
(74) *Attorney, Agent, or Firm*—Graham S. Jones, II; H. Daniel Schnurmann

(57) ABSTRACT

A method of forming an SRAM cell device includes the following steps. Form pass gate FET transistors and form a pair of vertical pull-down FET transistors with a first common body and a first common source in a silicon layer patterned into parallel islands formed on a planar insulator. Etch down through upper diffusions between cross-coupled inverter FET transistors to form pull-down isolation spaces bisecting the upper strata of pull-up and pull-down drain regions of the pair of vertical pull-down FET transistors, with the isolation spaces reaching down to the common body strata. Form a pair of vertical pull-up FET transistors with a second common body and a second common drain. Then, connect the FET transistors to form an SRAM cell.

20 Claims, 13 Drawing Sheets

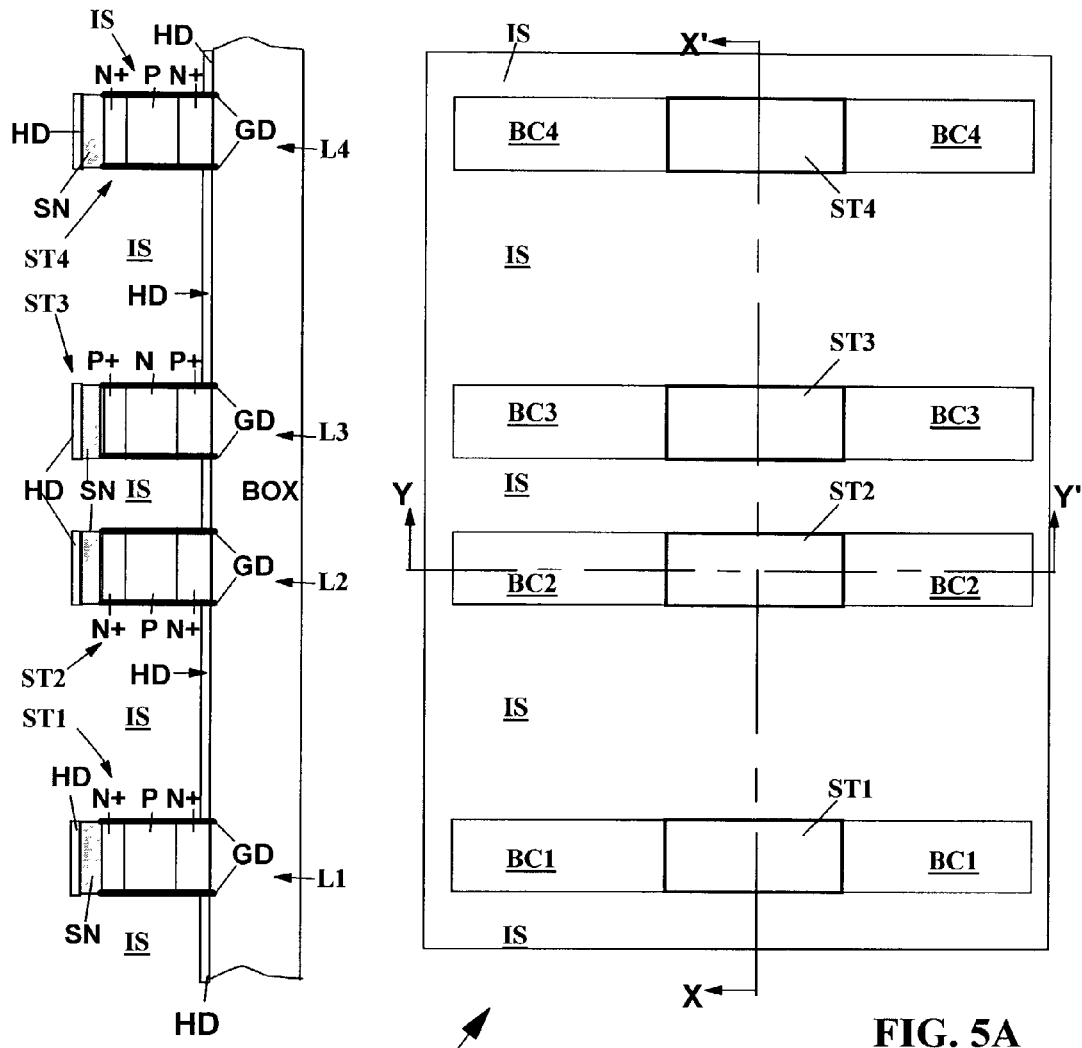
FIG. 5C
FIG. 5A
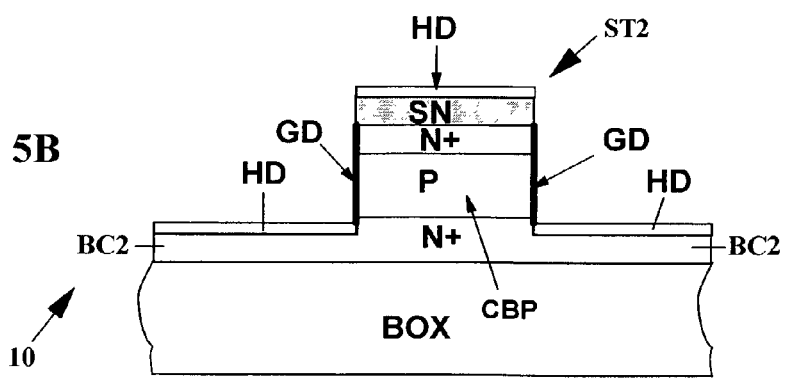
FIG. 5B

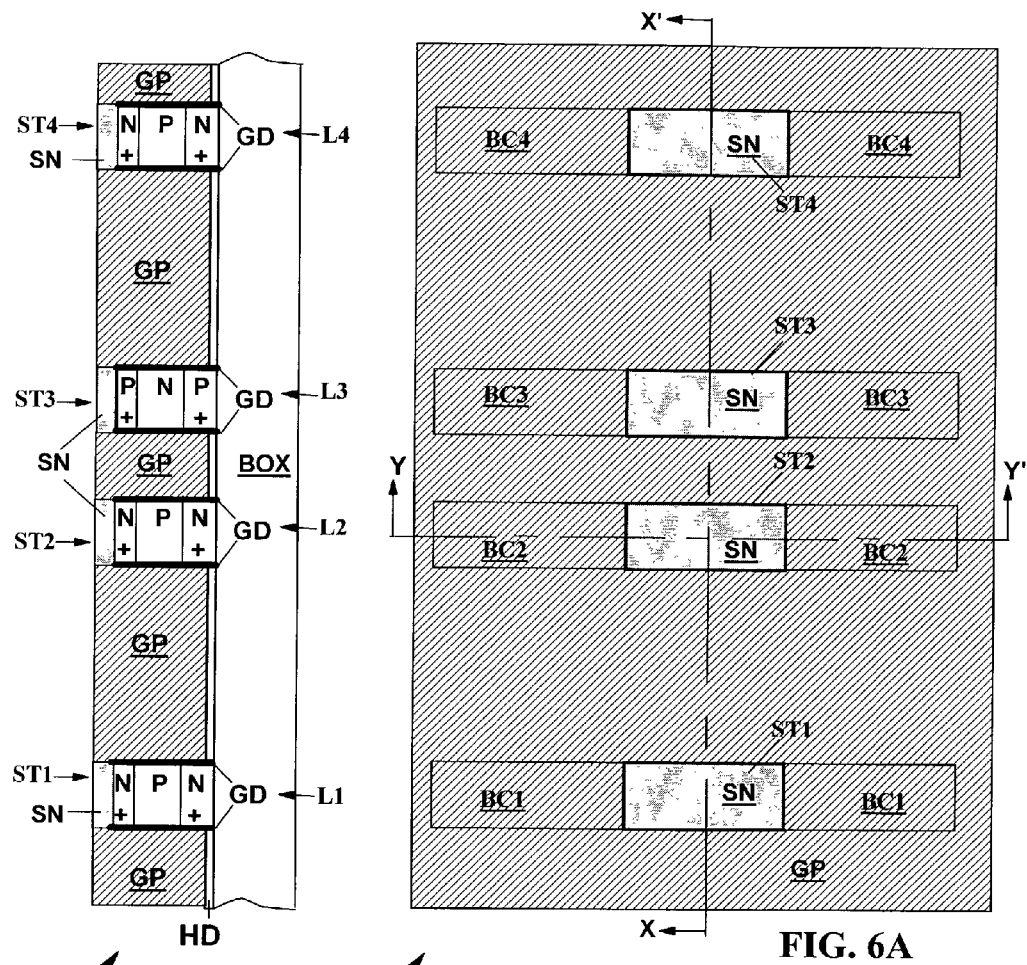
FIG. 6C
FIG. 6A
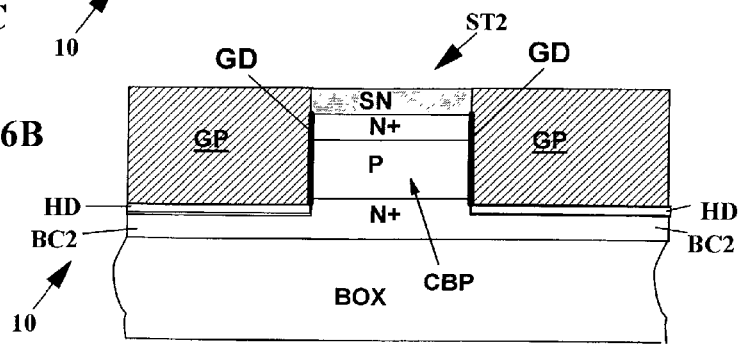
FIG. 6B

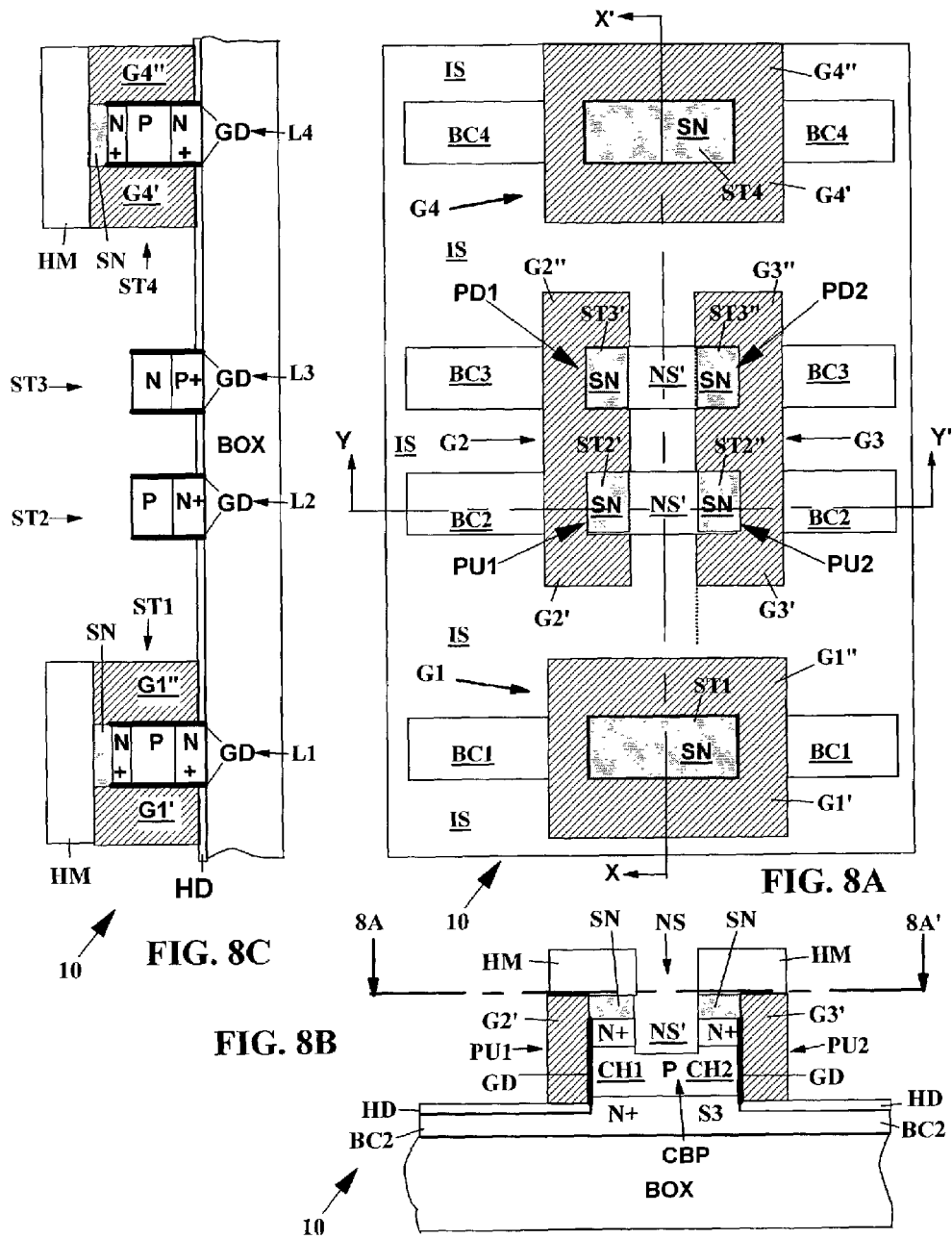

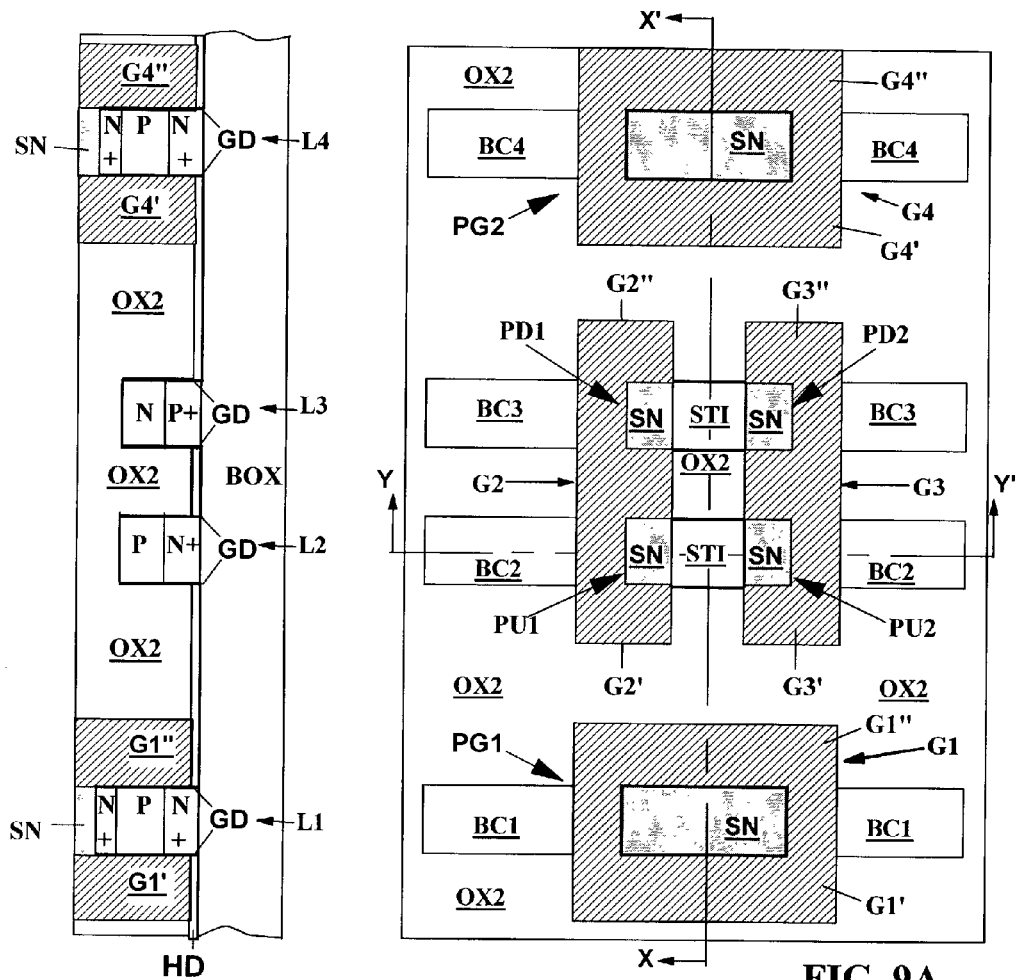
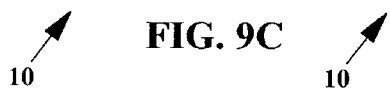
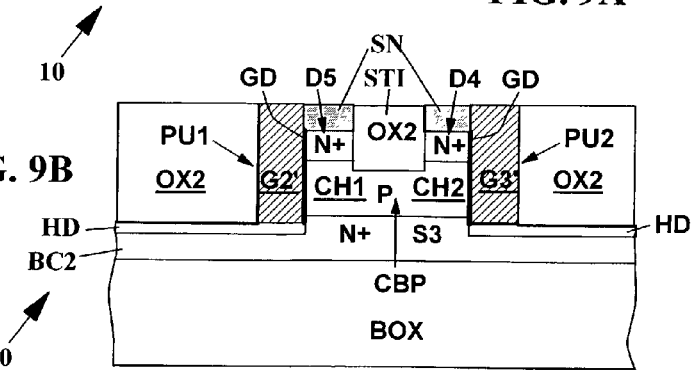
FIG. 9C
FIG. 9A
FIG. 9B

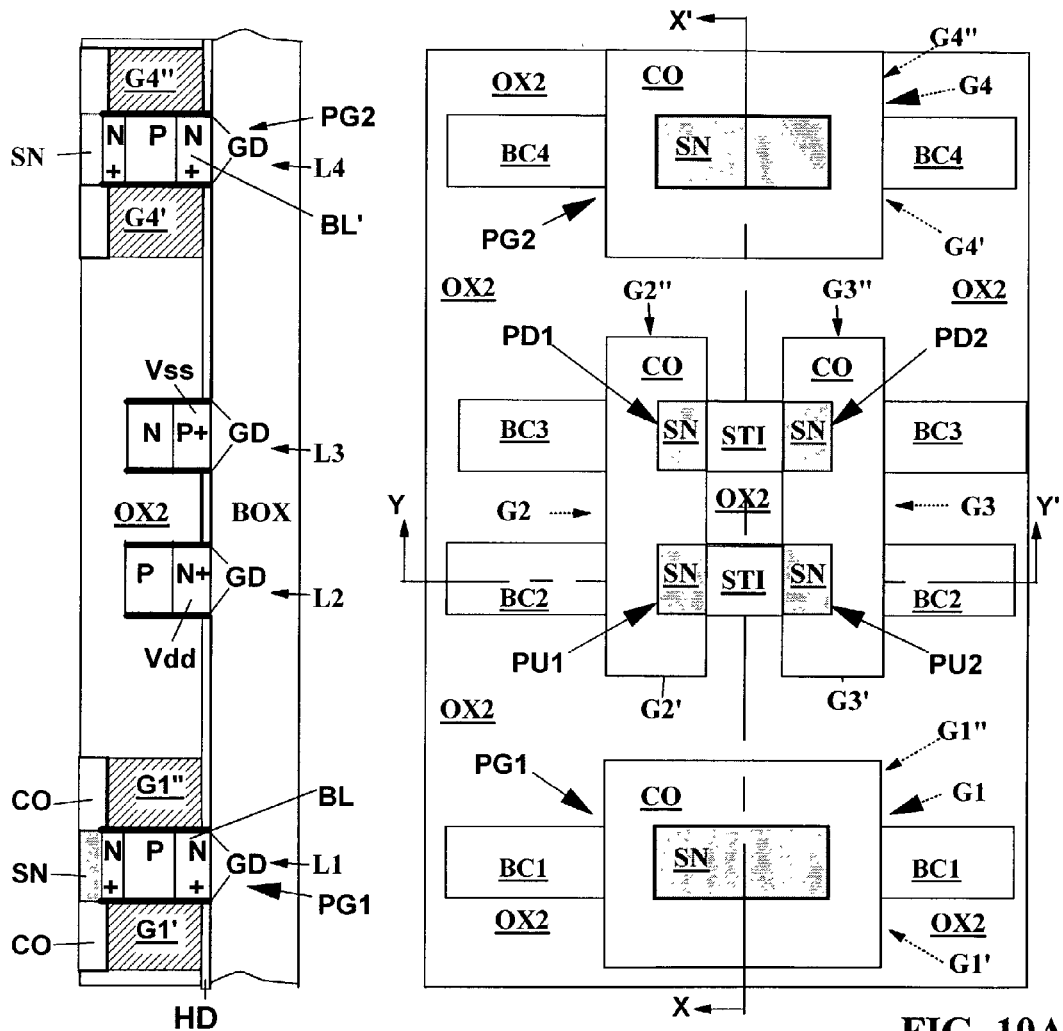
FIG. 10C
FIG. 10A
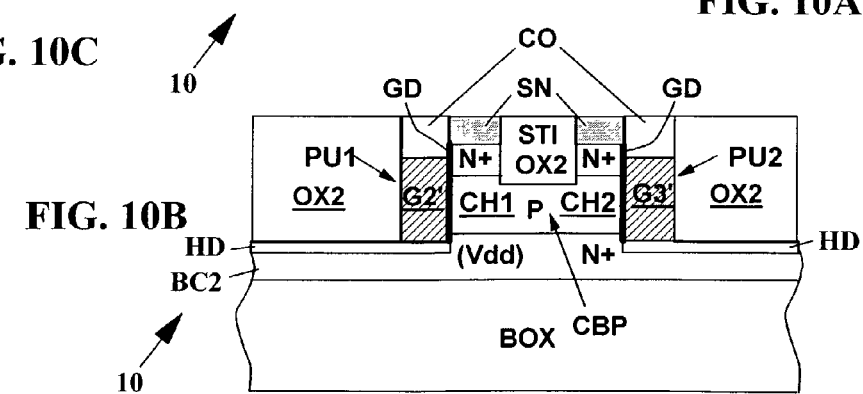
FIG. 10B

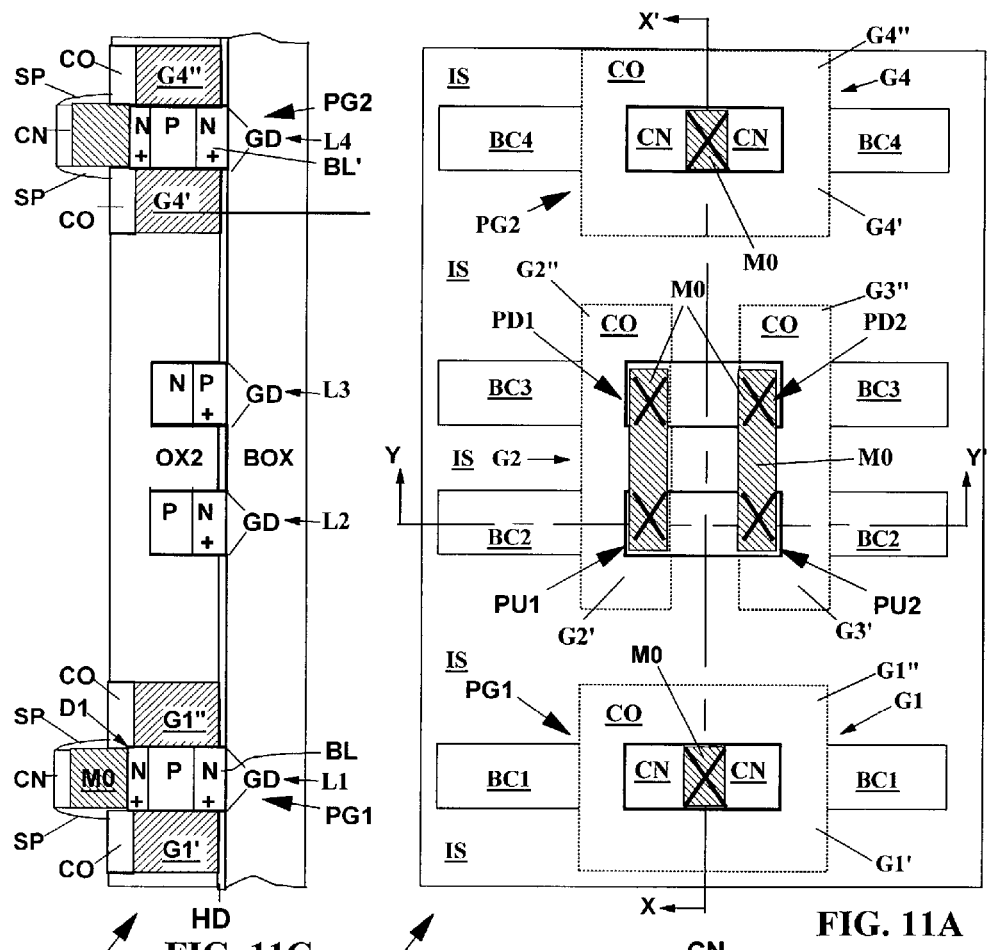
FIG. 11C
FIG. 11A
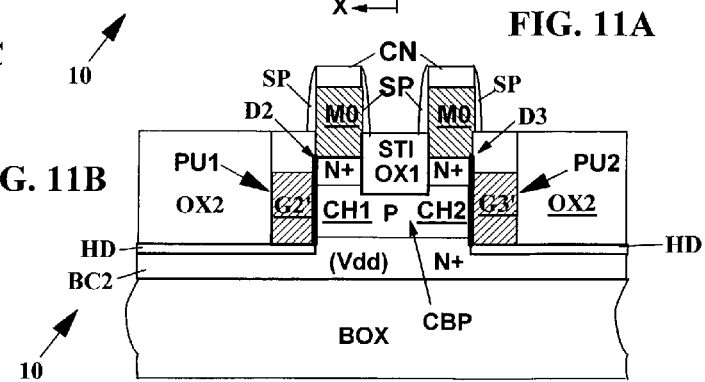
FIG. 11B

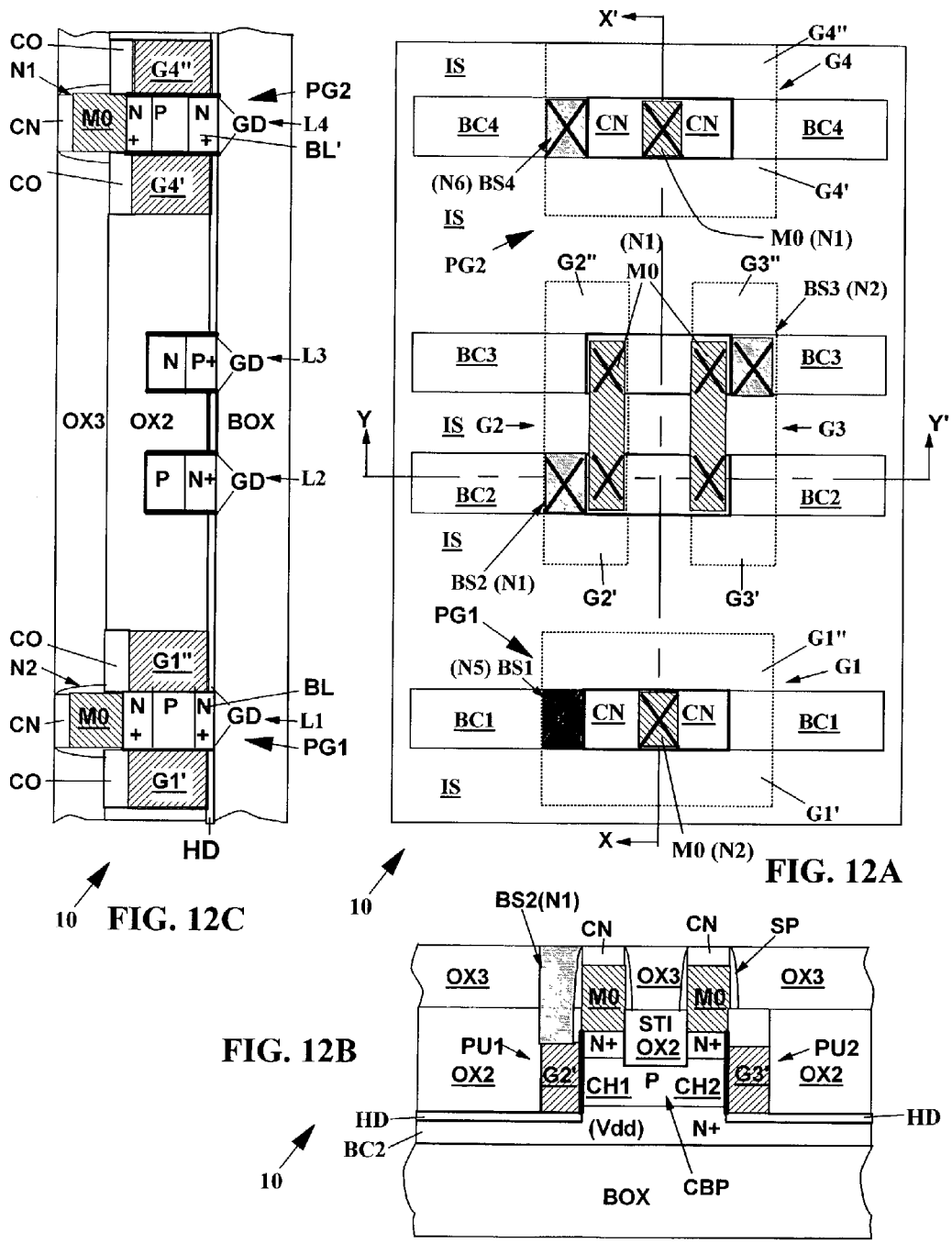

VERTICAL MOSFET SRAM CELL

BACKGROUND OF THE INVENTION

1. Field of the Invention

This invention relates to MOSFET SRAM cells and more particularly to a method of manufacturing a Vertical MOSFET SRAM cell and the structure provided thereby.

2. Description of Related Art

Use of vertical channel MOSFETs enables precise control of channel length, for high performance applications.

U.S. Pat. No. 6,477,080 of Noble for "Circuits and Methods for a Static Random Access Memory Using Vertical Transistors" describes a vertical SRAM device with floating bodies of the FET devices in the SRAM circuit. The patent also states as follows:

"The n-channel and p-channel transistors of memory cell . . . have gates that are formed of n+ and p+ polysilicon, respectively. The polysilicon gates in an inverter are coupled together with a gate contact that is formed of a refractory metal so as to provide a dual work function feature for desired surface channel characteristics in each transistor in the inverter. It is noted that the device bodies of the transistors in memory cell . . . are isolated from each other and the substrate such that the transistors exhibit semiconductor-on-insulator characteristics. Thus, the transistors may be fully depleted, floating body devices and no CMOS wells are needed for isolation.

"However, a body contact can be included using the technique of U.S. application Ser. No. 08/889,396, . . . ", (now U.S. Pat. No. 5,909,618 of Forbes et al. entitled "Memory Cell with Vertical Transistor and Buried Word and Body Lines").

We believe that there is a problem with a structure with individual floating body devices the components of the cross coupled inverters of an SRAM circuit. The problem is that with individual floating body devices the devices suffer from Vt mismatch, which means that the values of matched pull-up transistor pairs and matched pull-down transistor pairs will float to divergent Vt values due to body charging. In addition to potential loss of data due to errors caused by highly divergent Vt values, in less serious cases of Vt mismatch the result will be a compromise in the sensitivity of the cell. When the Vt values of the matched transistor pairs diverge, there is a significant risk of loss of data. Thus, the idea of external connections to the bodies of the FET devices are an alternative which could overcome the Vt mismatch problem.

The alternative of providing external body contacts is undesirable in that valuable surface area of the SRAM structure will be required to locate the contacts. Accordingly, it is believed that there is a need to find an alternative to either of the suggestions made by Noble.

While the Noble patent recognizes that the floating bodies of the FET devices is a concern. the citation of the application describing contacts to the bodies such that they can be held at a specific potential would exact a price would have to be paid in terms of extra cell area and process complexity. We recognize that by tying the bodies of the pull-downs together, and the pull-ups together, Vt matching is achieved.

The general direction of the industry is to scale aggressively the minimal lithographic dimension F (this is what one can print with photolithography). At present, a typical integrated circuit (IC) has F of 0.18 μm (1800 Å), while a high performance circuit has a cutting edge F of 0.13 μm (1300A), while processes and structures for 0.1 μm (1000 Å) F technology are being in development. Another general trend in the semiconductor industry is the reduction of relative area of various memory cells, that is a planar SRAM cell in 0.18 μm technology is measured 120–140$F^2$ while in 0.13 technology it is smaller 100–120$F^2$. It is highly desirable to have memory cells that can be scaled to the technology with F<0.1 μm without a substantial penalty in the relative area.

Noble's preferred embodiment is given for F=0.3 μm (column 5, line 15). There could be some features in the structure that have sublithographic dimensions. Deposition and etching techniques allows for the creation of such sublithographic features. For instance, in an extreme case, both deposition and etching can be controlled with a precision of one atomic monolayer (which is about 1–5 Å depending on particular chemical bonds). In practice, the control of these features are within 10% of the targeted deposition and/or removal. That is, one has available deposition and etching techniques that can routinely and reliably create/remove layers of 10–50 Å thick. A combination of such deposition techniques can be used to create more elaborate sublithographic structures. For instance, a borderless contact is defined by two (or more) sublithographic spacers formed on the walls of narrow lithography-defined 1F-wide trench. The material in between the spacers is etched selectively to the material of spacers, thus providing an opening with the width of 1F minus 2× spacer thickness.

In Noble's patent, the spacer thickness is ¼F and the opening thickness is ½F. In general, in order to make an elaborate sublithographic structure such as a borderless contact one has to use a none obvious combination of materials and process steps that would translate the precision of deposition and etching techniques into the useful three-dimensional structure. Often that none-obvious combination of materials and process steps may results in drawbacks and/or incompatibility with other structures.

The Noble patent teaches a borderless (sublithographic) structure between conductors that utilizes (a) formation of sublithographic overhang SiN spacers, (b) removal of one of the spacers with the aid of a photolithographic mask, (c) creating a one-sided sublithographic trench, (d) filling the trench with intrinsic polysilicon, (e) etching the oxide cap selective to the intrinsic polysilicon to create a space for the conductor. Note that the conductors are separated by the sublithographic (~¼F) layer of intrinsic polysilicon. The intrinsic silicon is then partially removed in a layer and left in the other portions of the circuit as 530. The intrinsic polysilicon is not a good insulator material. It should be very thick in order to effectively isolate conductors. Even at F=0.3 μm , the polysilicon layer of 750 Å can hardly isolate the metallic conductors due to the residual doping and dopant outdiffusion from heavily doped source/drain. At F=0.1 μm, the polysilicon spacer becomes only 250 Å and surely result in the shorted structure.

In our case, the structure does not have any limitation due to the dopant outdiffusion and/or residual doping level. In fact, various conductor layers will isolated even at a technology node with F=0.03 μm. Between 0.3 μm and 0.03 μmm is two (2) orders of magnitude.

U.S. Pat. No. 5,909,618 of Forbes et al. entitled "Memory Cell with Vertical Transistor and Buried Word and Body Lines" describes and shows (FIG. 4 thereof) a DRAM device with a body line (208) juxtaposed with a pair of body regions (214) that forms a very complicated body contact structure. The body line (208) which provides mechanical and electrical body contacts to vertical sidewalls (223) of body regions (130) is formed on top of what appears to be a buried isolation layer (400). In order simply to make contact to the body regions (214) of two adjacent devices Forbes forms a recessed spacer (218) along with isolation layer (400) is provided for isolation of the body line (208) from the source region (212), and then forms the body line (208). Another complexity of Forbes is that the body line (208) is recessed so that it will not contact to the drain layer (216).

U.S. Pat. No. 6,133,608 of Flaker, et al. for "SOI-Body Selective Link Method and Apparatus", which does not relate to vertical transistors, describes a planar FET SRAM silicon-on-insulator (SOI) structure and method of making the same includes an SOI wafer having a silicon layer of an original thickness dimension formed upon an isolation oxidation layer. At least two p-type bodies of at least two SOI field effect transistors (PFETs) are formed in the silicon layer. At least two n-type bodies of at least two SOI field effect transistors (NFETs) are also formed in the silicon layer. A conductive body link is formed in the silicon layer of the SOI wafer over a silicon oxide isolation layer for selectively connecting desired bodies of either the p-type SOI FETs or the n-type SOI FETs and for allowing the connected bodies to float.

The Flaker et al. patent states as follows: "For SOI devices, since all the bodies are floating, the initial body potential can range from near ground to near Vdd (when considering both NFETs and PFETs whose source may not necessarily be grounded or tied to Vdd). As referred to herein above, this produces a large Vt mismatch. This mismatch can slow down sensing (i.e., a slower set pulse is required) or it results in a complete failure to set the latch in a proper direction. The Flaker et al. patent also states as follows "By linking the bodies of pairs of devices, much of the performance advantage of SOI relative to bulk CMOS is maintained (e.g., dynamic Vt lowering). On the other hand, if all bodies were tied together, the charge state of any one device would not significantly affect the body potential. In addition, in the instance if all bodies were tied together, performance would approach a performance of bulk devices (except for reduced junction capacitance)." The problems with the Flaker et al. patent are that it relates to planar SRAM devices, not Vertical SRAM devices and it does not suggest a process for forming such devices. In addition, the Flaker et al. patent does not provide any guidance as to the kind of process to employ in the manufacture of a vertical SRAM device or the structure of a vertical SRAM device.

There is a problem of providing a Vertical SRAM device without the problems of floating body variations in Vt mismatch which are unreliable since they can destroy data on the one hand or the consumption of surface are of the devices to provide contacts to the bodies of the FET devices to overcome the Vt mismatch problems.

For a DRAM application, such those taught by Forbes et al which teaches at col 12 lines 58–62 thereof that Vt must remain sufficiently high to avoid sub-threshold leakage. Negative wordline (WL) low is not contemplated. There are problems with the scheme used for body contacting in Forbes et al. First, there is a need to align of the body contact precisely vertically with the channel to avoid leakage between the source/drain diffusions and the body contact. Secondly, the presence of the body contact in such close proximity to the gated channel and diffusions may introduce an extremely high carrier recombination velocity due to interfacial defects that would burden transistor operation with significant leakage currents.

SUMMARY OF THE INVENTION

In accordance with this invention an advantage is that there is no area penalty compared to a contacted body layout.

Further in accordance with this common bodies of pairs of vertical MOSFET's are connected together to achieve Vt matching.

Another object is to interconnect body layers without the complications of forming a body line and since the process of this invention requires simply recessing the drain region until it falls below the body layer. Without the buried isolation layer and a buried recessed spacer of Forbes et al. supra the process is simple and straightforward.

The pass gate or transfer devices in accordance with this invention have replaced the conventional single sided gate, with a surrounded gate which provides a much higher transconductance due to three dimensional (3D) channel volume depletion, more drivability and efficiency. As the result, the SRAM cell will suffer less disturbance, or better cell stability.

In accordance with the present invention the bodies of opposing cross-coupled CMOS inverters in the form of vertical MOSFETs are interconnected without the need to actually form a contact (by using a contiguous region of single crystal silicon). The object is to achieve Vt matching without being as concerned with the absolute value of Vt. The value of Vt always remains reasonably low due to the fact that at least one of the pair of connected transistors will be in a body charging mode at any given time. Thus the body charge is shared for the cross-coupled CMOS inverters in our cell. Thus, for the cross-coupled CMOS inverters of an SRAM cell in accordance with this invention, a value of low Vt is not a critical concern.

The structure provided by the present invention completely avoids any concern about vertical alignment of the body contact precisely with the channel to avoid leakage between source/drain diffusions and the body contact which exist for the Forbes et al. embodiment. The structure provided by the present invention also completely avoids any concern about the presence of a body contact in close proximity to a gated channel and diffusions (which would be likely to introduce an extremely high carrier recombination velocity due to interfacial defects that would burden transistor operation with significant leakage currents) which exist for the Forbes et al. embodiment. The above concerns are overcome since interconnection between opposing vertical MOSFET devices is made by an undisturbed single crystal silicon bridge forming a common body for those MOSFET devices.

In accordance with this invention, a vertical Static Random Access Memory (SRAM) cell device is formed by the following steps. Form pass gate FET transistors and form a pair of vertical pull-down FET transistors with a first common body and a first common source in a silicon layer patterned into parallel islands formed on a planar insulator.

Preferably, form the pull-up FET transistors with first common source, a first common body and a first common drain and then bisect the first common drain with a first dielectric isolation region form the pull-down FET transistors with a second common source, a second common body and a second common drain regions and then bisect the second common drain with a second dielectric isolation region. The pass gate FET transistors are selected from the group consist of planar and vertical transistors. Preferably, the SRAM device includes dual pairs of pass gate FET transistors; the FET transistors with are formed with a sublithographic borderless contact structure between the upper diffusion area of non-planar transistor and a zero (M0) metallization layer; the FET transistors are connected with a sublithographic borderless contact structure formed between the gate electrode of non-planar transistor and a zero (M0) metallization layer.

Preferably, the FET transistors are connected with a sublithographic borderless contact structure formed between the gate electrode of a non-planar transistor and a second metallization layer; the common gate electrodes interconnect pull-down and pull-up vertical FETs; the gate electrode is made of a heavily doped polycrystalline semiconductor material selected from the group consisting of Si, SiGe, SiGeC Preferably the device is a silicon on insulation device formed by the steps as follows:

forming a silicon layer on a planar insulator, patterning the silicon layer into parallel islands, forming a pull-up island with doped vertical pull-up strata in a first one of the parallel island comprising an upper pull-up stratum, a pull-up body stratum and a pull-up lower stratum, the upper pull-up stratum and the pull-up lower stratum having opposite types of dopant from the pull-up body stratum, forming a pull-down island with doped vertical pull-down strata in a second one of the parallel islands comprising an upper pull-down stratum, a pull-down body stratum and a pull-down lower stratum, the upper pull-down stratum and the pull-down lower stratum having opposite types of dopant from the pull-down body stratum.

Preferably, etch down through upper diffusions between cross-coupled inverter FET transistors to form pull-down isolation spaces bisecting the upper strata of pull-up and pull-down drain regions of the pair of vertical pull-down FET transistors, with the isolation spaces reaching down to the common body strata. Form a pair of vertical pull-up FET transistors with a second common body and a second common drain. Then, connect the FET transistors to form an SRAM cell.

Preferably, etch down through upper diffusions between cross-coupled inverter FET transistors to form pull-down isolation spaces bisecting the upper strata of pull-up and pull-down drain regions of the pair of vertical pull-down FET transistors, with the isolation spaces reaching down to the common body strata. Form a pair of vertical pull-up FET transistors with a second common body and a second common drain. Etch to form a pull-down isolation space bisecting the upper pull-down stratum to form pull-down drain regions of the pair of vertical pull-down FET transistors, with the pull-down isolation space reaching down to the pull-down body stratum; etch to form a pull-up isolation space bisecting the upper pull-up stratum to form pull-up drain regions of the pair of vertical pull-up FET transistors, with the pull-up isolation space reaching down to the pull-up body stratum, fill the pull-down isolation space and the pull-up isolation space with an isolation dielectric.

Form a common diffusion for the uppermost diffusion of an FET and then etching the diffusion to form a recess thereby forming isolated diffusions above a common body. Form a common diffusion for the uppermost diffusion of an FET; etch the common diffusion to form a recess above each of the first common body and the second common body thereby forming isolated diffusions above each of the first common body and the second common body and fill each recess with a dielectric material. Form common gate electrodes that interconnect cross coupled pull-down and pull-up vertical FET transistors. Form the gate electrode of a heavily doped polycrystalline semiconductor material selected from the group consisting of Si, SiGe, SiGeC; form the gate electrode is made entirely or partially of metallic conductor; form the gate electrode completely or partially surrounding the transistor bodies of pass gate transistors. Form common gate electrodes interconnected to pull-down and pull-up vertical Further in accordance with this invention, a vertical Static Random Access Memory (SRAM) cell device comprises the following. The SRAM includes a pair of pass gate vertical FET transistors, a pair of vertical pull-down FET transistors with a first common body and a first common source, a pair of vertical pull-up FET transistors with a second common body and a second common source, and the FET transistors being connected in an SRAM cell circuit.

BRIEF DESCRIPTION OF THE DRAWINGS

The foregoing and other MOSFET SRAM aspects and advantages of this invention are explained and described below with reference to the accompanying drawings, in which.

DESCRIPTION OF THE PREFERRED EMBODIMENT

Figure 1A:
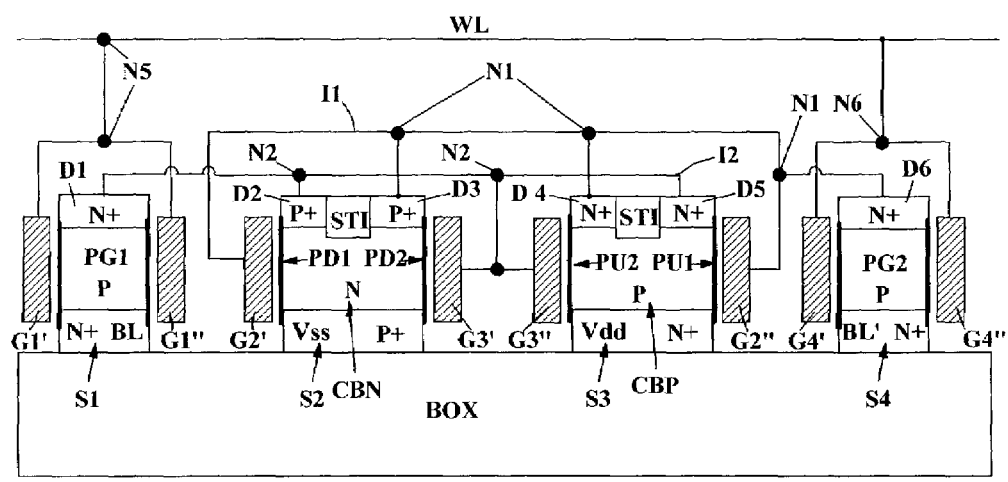
FIG. 1A illustrates a structure made in accordance with the method of this invention comprising an SRAM cell including a cross-coupled latch device solely comprising Vertical Channel MOSFETs (Metal Oxide Semiconductor Field Effect Transistors) with pull-up inverters with common bodies and pull-down inverters with common bodies.

FIG. 1A illustrates a structure made in accordance with the method of this invention comprising an SRAM cell circuit 10 including a cross-coupled latch device solely comprising vertical channel MOSFETs (Metal Oxide Semiconductor Field Effect Transistors). The entire cell circuit 10, including the pass gate transistors PG1/PG2 and the cross-coupled inverters formed by four MOSFET transistors PD1, PD2, PU1 and PU2, occupies an area (including isolation) of $112F^2$. Interconnection of the drains D2/D5 and D3/D4 of the cross-coupled pairs of MOSFET transistors PD1, PD2, PU1 and PU2 in the SRAM circuit is provided by lower level wiring M0 and studs which are borderless to the gate conductors. The next level of wiring M1, which is borderless to the lower level wiring M0, is used to cross-couple the inverters PD1, PD2, PU1 and PU2 and to connect their outputs to the pass gate MOSFETs PG1 and PG2 of the SRAM cell circuit 10.

However, the size of the SRAM device can be reduced to below $100F^2$, if the vertical gates are fabricated using a sub-lithographic technique, such as forming sidewall spacer gates.

Furthermore, in accordance with this invention the vertical MOSFETs of the cross-coupled inverters are gated on opposing sides, resulting in still more on-current relative to single sided gated devices.

The pass gate MOSFETs of this invention are referred to herein as "surround gate devices" because the gate electrode structures of the pass gate electrodes surround the sources, drains and channels of the pass gate MOSFETs.

A key advantage of the SRAM cell of this invention is that it can be operated at a lower voltage than a conventional SRAM cell due to the vertical device configuration and the surrounding gate structure, resulting in low-power.

As seen in FIG. 1A, bitline conductors BL/BL' are formed by buried diffusion lines, which may be periodically strapped with an overlying metal layer or an overlying silicide layer for reduced resistance. Similarly, Vdd and Vss lines comprise buried diffusions. Both can employ borderless contacts to achieve area reduction.

FIG. 1A is a schematic illustration of a cell arrangement in accordance with this invention comprising an SRAM cell circuit 10 formed solely by vertical MOSFETs, with an SOI (Silicon On Insulator) SRAM structure 10 a set of six vertical channel FETs formed on the exterior surface of a back oxide layer BOX, which may be formed of silicon oxide. The term "BOX" (which is often used to refer to a Back OXide layer, also known as as a Buried OXide layer) is employed herein as a convenient reference character, to identify the back oxide layer in the drawings.

The six FETs formed above the back oxide layer BOX include two pass gate transistors PG1/PG2, two pull-up transistors PU1/PU2 and two pull-down transistors PD1/PD2. The pull-up transistors PU1/PU2 and the pull-down transistors PD1/PD2 are cross-coupled as explained above by common gate electrode structures G2 and G3 as shown in FIG. 6A and subsequent drawings.

The common gate structure G2 is shared by pull-down transistor PD1 and pull-up transistor PU1, which include gate electrode G2' and gate electrode G2" respectively. Portions of the common gate electrode structure G2 are shown in FIG. 1A as gate electrode G2' of pull-down transistor PD1 and gate electrode G2" of pull-up transistor PU1.

A similar common gate structure G3 is shared by pull-down transistor PD2 and pull-up transistor PU2, which include gate electrode G3' and gate electrode G3" respectively. Portions of the common gate electrode structure G3 are shown in FIG. 1A as gate electrode G3' of pull-down transistor PD2 and gate electrode G3" of pull-up transistor PU2.

Each of the two pass gate transistors PG1/PG2 includes an N+/P/N+ vertical stack of doped regions including N+ doped drain regions D1/D6 on top and source regions S1/S4 on the bottom of the respective stacks with a P doped channel region therebetween. In addition, the pass gates PG1/PG2 have configurations with the vertical stacks ST1/ST4 surrounded laterally by gate conductors G1/G4 (see FIGS. 8A et seq.) providing a great deal more gate electrode surface area juxtaposed with the P doped channels and the N+ doped source and drain regions.

The pass gate transistor PG1, which includes a gate electrode G1 with gate electrode sections G1' and G1" shown on the left and right sides thereof, has vertical active areas of an FET with a central channel region doped P sandwiched between N+ doped drain/source regions D1/S1 thereabove and therebelow. In fact the gate electrode sections G1'/G1" of gate G1 surround the vertical active areas of pass gate transistor PG1 as seen in FIGS. 10A/10C and similar plan views. Similarly, the gate electrode sections G4'/G4" of gate electrode G4 surround the vertical active areas of pass gate transistor PG2 as seen in FIGS. 10A/10C and similar plan views.

The pass gate transistor PG2, which includes a gate electrode G4 with gate electrode segments G4' and G4" shown on the left and right sides thereof, has vertically stacked active areas of an FET with a central channel region doped P sandwiched between N+ doped drain/source regions D6/S4 thereabove and therebelow. In fact the gate electrode G4'/G4" surrounds the vertical active areas of the pass gate transistor PG2 as seen in FIGS. 10A/10C and similar plan views.

The two pull-up transistors PU1/PU2 share a common, channel body region CBP (with bilateral, vertical sidewalls upon which confronting gate electrode structures G2'/G3' are formed as shown in FIGS. 8B–13B), which provides a common Vt value therefor in accordance with this invention. The two pull-up transistors PU1/JPU2 are formed with common P doped channel body regions CBP above a common N+ doped source region S3. Above the channel body region CBP of the two pull-up transistors PU1/PU2 are separate N+ doped drain regions D1/D2 which are separated by a dielectric region STI therebetween, which is preferably a Shallow Trench Isolation region. Thus the two pull-up transistors PU1/PU2 have a common Vt value and both the common body CBP and the common source S3 lie below the split drains D4/D5 that are separated by the dielectric region STI.

Similarly, the two pull-down transistors PD2/PD1 share a common body region CBN, thereby having a common Vt value therefor in accordance with this invention. The two pull-down transistors PD1/PD2 are formed with common N doped, channel body regions CBN (with bilateral, vertical sidewalls upon which confronting gate electrode structures G2"/G3" are formed1 as are also shown in FIGS. 8B–13B) above a common P+ doped source region S2. The P+ doped drain regions D2/D3 of the two pull-down transistors PD1/PD2 are separated by a dielectric region STI therebetween, which preferably comprises a Shallow Trench Isolation STI region. Thus the two pull-down transistors PD1/PD2 have a common Vt value; and the common body CBN lies below the split drains D4/D5 that are separated by the dielectric region STI.

Figure 1B:
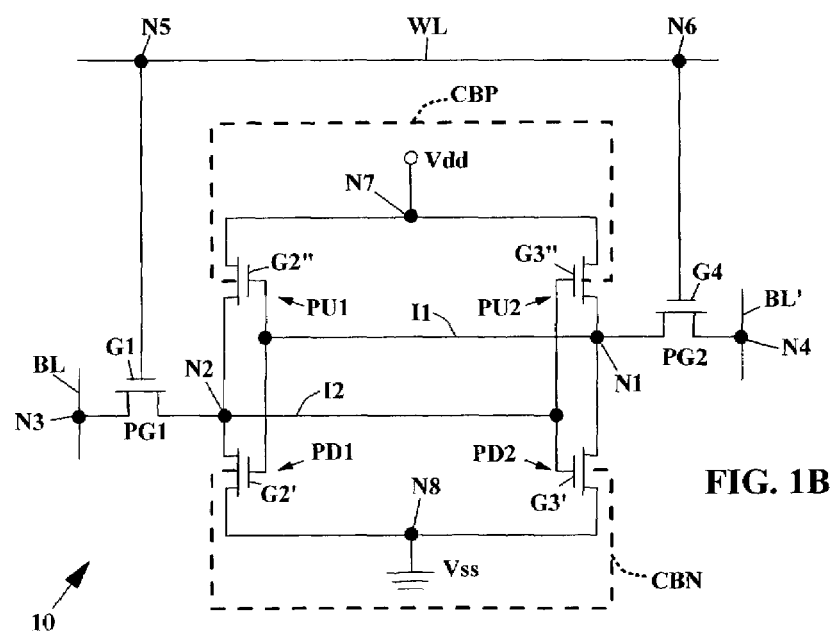
FIG. 1B shows a circuit diagram for the device of FIG. 1A.

FIG. 1B shows a circuit diagram for the device of FIG. 1A with gate G1 of pass gate transistor PG1 connected through node N5 to the wordline WL and the gate G4 of pass gate transistor PG2 connected through node N6 to the wordline WL.

The source S1 of pass gate transistor PG1 is connected to the bit line BL through node N3 and the drain D1 of pass gate transistor PG1 is connected through node N2 to the drains D2/D5 of transistors PU1 and PD1 and the gate electrodes of transistors PU2 and PD2.

The source S4 of pass gate transistor PG2 is connected to the bit line BL' through node N4 and the drain D6 of pass gate transistor PG2 is connected through node N1 to the drains D3/D4 of transistors PU2 and PD2 and the gate electrodes of transistors PU1 and PD1.

The pull-down transistors PD1/PD2, which have channel regions doped N sandwiched between P+ doped source/drain regions have gate electrodes G2/G3, respectively. The common source S2 of pull-down transistors PD1/PD2, which is located on the surface of the back oxide layer BOX connects through node N8 to the voltage Vss. As indicated above, the drain D2 of pull-down transistor PD1 is connected to node N2 and the drain D4 of pull-down transistor PU2 is connected to node N1.

The pull-up transistors PU1/PU2, which have channel regions doped N sandwiched between P+ doped source/drain regions, have gate electrodes G2'/G3', respectively. The common source S3 of pull-up transistors PU1/PU2, which is located on the surface of the back oxide layer BOX connects through node N7 to the power supply voltage source Vdd. As indicated above, the drain D5 of pull-up transistor PU1 is connected to node N2, and the drain D4 of pull-up transistor PU2 is connected to node N1.

Note that the lower dotted line CBN indicates that the channels of pull-down transistors PD1/PD2 are contained within the common body CBN and that the other dotted line CBP indicates that the channels of pull-up transistors PU1/PU2 are contained within the common body CBP.

Node N1 is cross linked via interconnection line I1 to the gate electrode G2' of pull-down transistor PD1 and to the gate electrode G2" of pull-up transistor PU1.

Node N2 is cross linked via interconnection line I2 to the gate electrodes G3' of pull-down transistor PD2 and to the gate electrodes G3 of pull-up transistor PU2.

The actual physical structure (as will be shown by the following figures) folds the cross-coupled pairs of NFETs PD1/PD2 and PFETs PU1/PU2 such that each pair of common gates G2 (G2'/G2") and G3 (G3'/G3") is coplanar.

PROCESS

The method of forming the structure of FIG. 1A and FIGS. 13A–13C in accordance with this invention is illustrated by FIGS. 2A–2C to FIGS. 13A–13C.

Formation of Silicon Islands of SOI Device

Figure 2C:
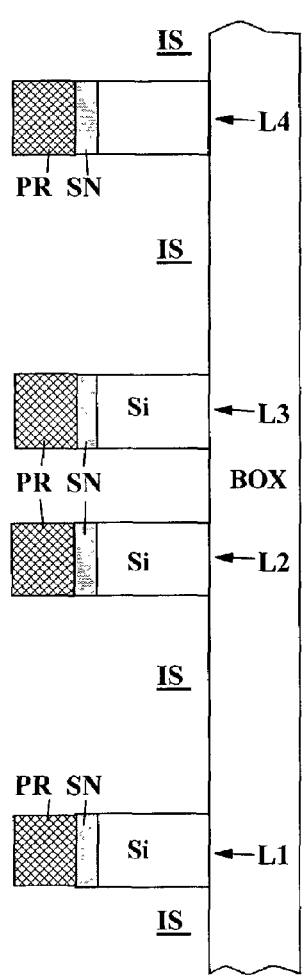
FIGS. 2A–2C to FIGS. 13A–13C illustrate processing steps in accordance with this invention for forming a Vertical SRAM device in accordance with the method of this invention.
Figure 2A:
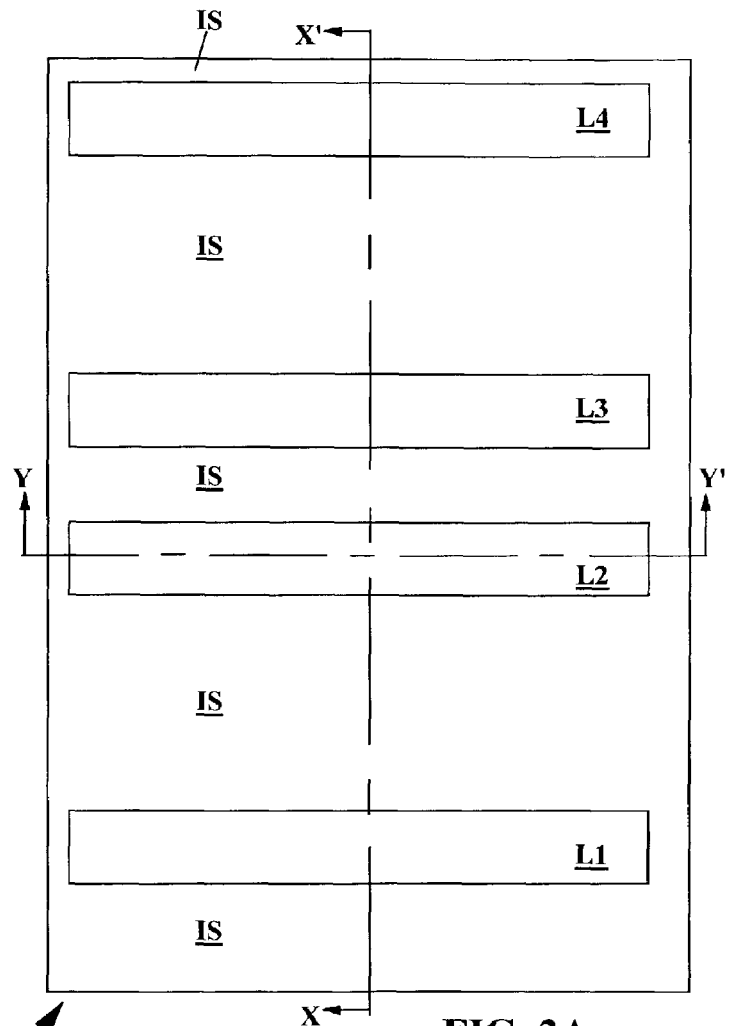
Figure 2B:
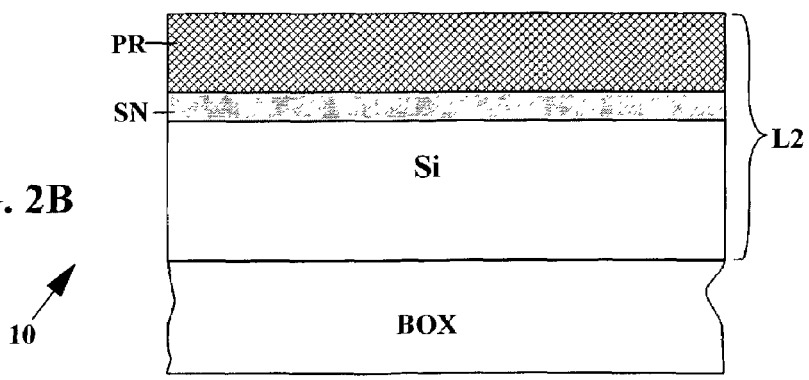

Referring to FIGS. 2A–2C an early stage in the manufacture of an exemplary embodiment of this invention is shown. The starting material is the standard Silicon On Insulator (SOI) wafer 10 comprising a back oxide layer BOX (formed of silicon oxide) covered with a silicon layer which has been covered with a silicon nitride, pad layer SN covered with a photoresist mask PR which has been used to form parallel, islands L1–L4 (which can also be viewed as horizontal, parallel stripes), which are composed of silicon Si and separated by isolation spaces IS (which can also be viewed as horizontal, parallel trenches as seen in FIGS. 2A and 2C).

FIG. 2A shows a plan view of a single cell of the SRAM device 10 of FIGS. 1A/1B on the surface of a wafer in which the pattern of parallel, islands L1–L4, which are composed of silicon, have been formed. The islands L1–L4 are separated by trench like isolation spaces IS therebetween above the back oxide layer BOX. As As indicated above, the isolation spaces IS extend horizontally, i.e. from left to right on the drawing.

FIG. 2B is a vertical elevation of the device 10 of FIG. 2A taken along section line Y–Y' bisecting the island L2 with the back oxide layer BOX (on the bottom of the drawing) supporting the silicon layer SI, above which is formed the thin silicon nitride, pad layer SN. The pad layer SN is covered with a photoresist layer which has been patterned and used to form photoresist mask PR. The mask has been used for etching (preferably by an RIE (Reactive Ion Etching) process) to remove the unwanted portions of the pad layer SN and the silicon layer SI thereby forming the islands L1–L4.

In FIG. 2C, which is a left elevational view that is taken along line X—X' of FIG. 2A, the isolation spaces IS between the islands L1–L4 are shown as having been etched through the photoresist mask PR, the silicon nitride, pad layer SN and the silicon Si to the exterior surface of the back oxide layer BOX.

As indicated above, the etching process is employed to etch through the silicon layer Si of the SOI device to form the set of islands L1–L4 on the surface of the back oxide layer BOX. Standard patterning techniques such as deposition of pad layer SN, deposition of photoresist layer PR, and patterning of photoresist layer PR in accordance with conventional photolithographic techniques can be employed to pattern the islands L1–L4. Following the patterning of pad layer SN using the patterned photoresist PR as a mask to convert the pad layer SN into a intermediate masking layer, the silicon is etched by an RIE active species which is selective to protect the masking material and to the silicon oxide of the back oxide BOX while removing the silicon nitride SN and silicon Si exposed through the photoresist mask PR. The RIE etching process continues through the silicon Si until the exterior (top) surface of the back oxide BOX is reached, where the etching process stops, as will be well understood by those skilled in the art.

Ion Implanting Islands with Vertical Source/Drain and Channel Regions

Figure 3C:
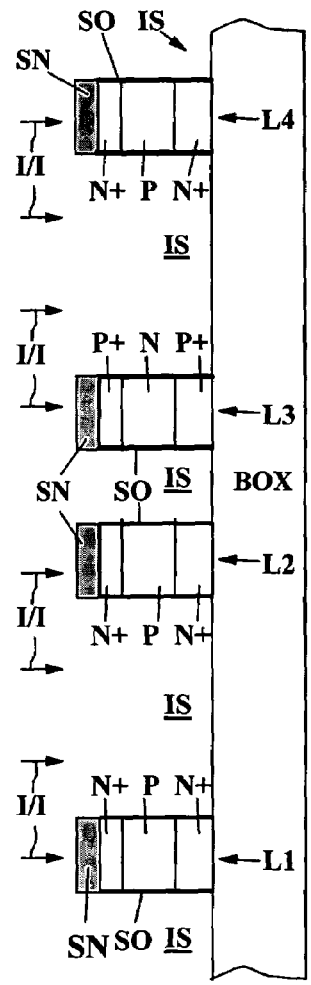
Figure 3A:
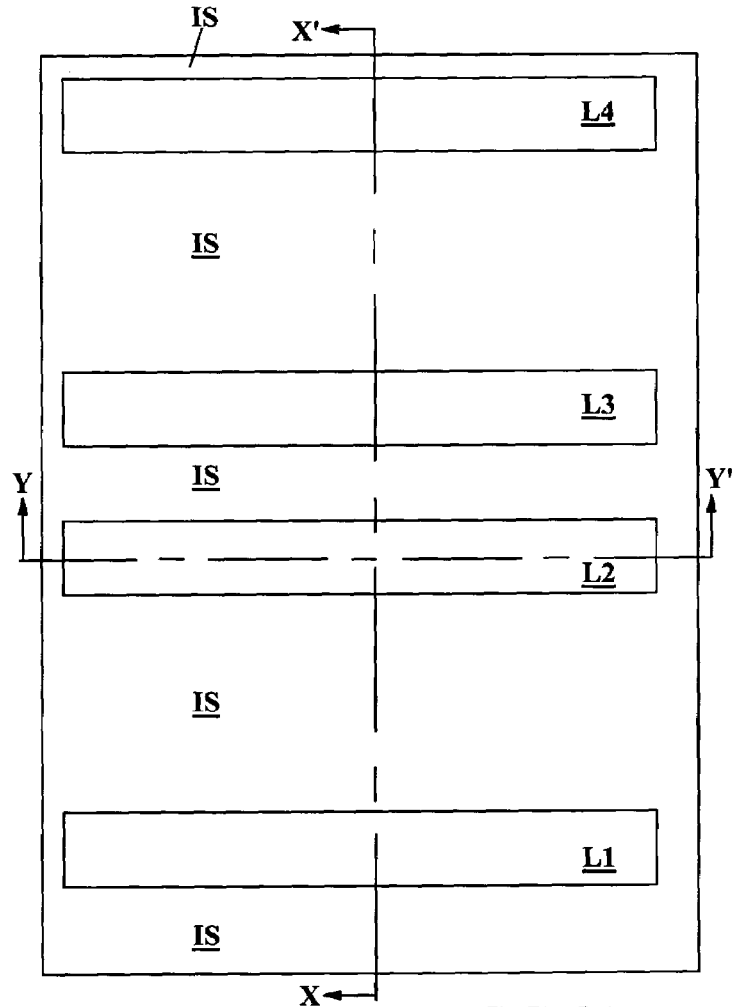
Figure 3B:
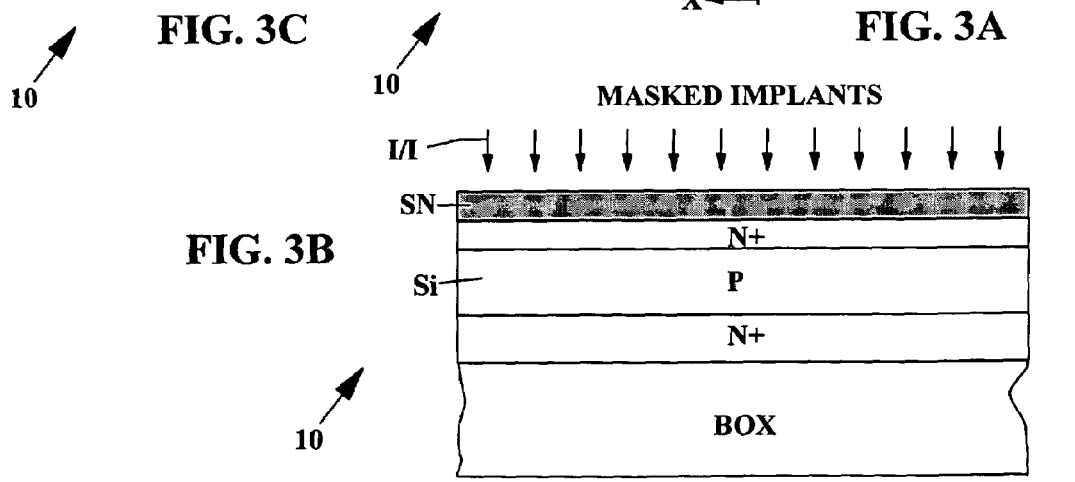

FIGS. 3A–3C show the structure of FIGS. 2A–2C after performance of masked ion implants, using block masks (not shown). The sidewalls of the islands L1–L4 have been coated temporarily with a thin layer of a sacrificial silicon oxide layer SO. The parallel silicon islands L1–L4 are shown being selectively implanted vertically in an ion implantation step with N and P type dopant.

In the case of island L3, as will be understood by those skilled in the art, a sequence of ion implantation steps produces the vertical stacks of P+/N/P+ doped silicon regions, which will be used in subsequent processing steps as indicated by FIGS. 4A–4C to 13A–13C to form the source, channel, and drain regions of the pull-down transistors PD1/PD2.

In the case of islands L1, L2, and L4, as will be understood by those skilled in the art, a sequence of ion implantation steps produces the vertical stacks of N+/P/N+ doped silicon regions, which will be used in subsequent processing steps as indicated by FIGS. 4A–4C to 13A–13C to form the source, channel, and drain regions of the pull-up transistors PU1/PU2.

In particular, the doping process is being performed to form the source/drain and channel regions which will ultimately be formed into the remaining transistors PG1, PU2/PU1 and PG2 respectively (see FIG. 1A), as shown in some detail with reference to FIGS. 9A–9C, FIGS. 10A–10C and FIGS. 11A–11C, which are described in detail below. The two outer islands L1/L4 are being prepared for formation of contain vertical NMOS FETs for the pass gate transistors PG1/PG2, buried bitline diffusion and its complement of FIG. 1A. The two inner islands L2–L3 are being prepared for production of contain cross-coupled inverters comprising the four vertical MOSFETs PU1/PU2/PD1/PD2, and buried Vdd and Vss lines shown n FIG. 1A. After completion of the ion implantation steps, the sacrificial silicon oxide layer SO is then removed.

Formation of Hard Mask for Patterning Device Stacks

Figure 4C:
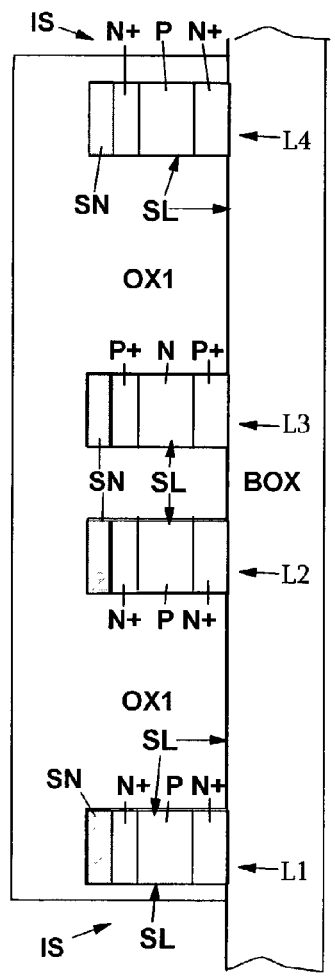
Figure 4A:
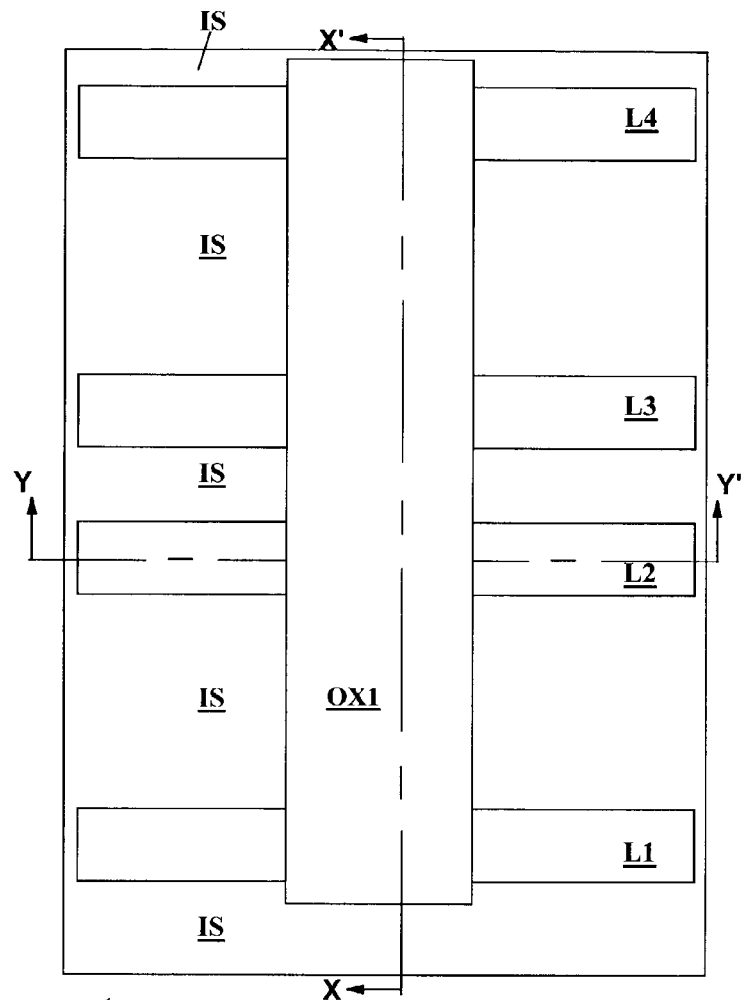
Figure 4B:
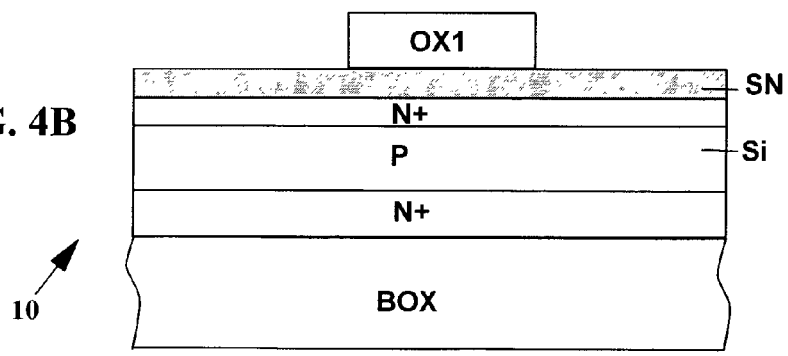

FIGS. 4A–4C show the structure of FIGS. 3A–3C after a thin silicon nitride liner SL was conformally deposited covering the surface of the device including the pad layer SN, the sidewalls of the islands L1–L4 and back oxide layer BOX. The thin silicon nitride liner SL was provided to be patterned into an etch stop layer for a subsequent RIE etching step. The next step was to form the hard mask OX1. First a blanket layer of silicon oxide was deposited, planarized and patterned into the hard mask OX1. The hard mask OX1 is formed by a process such as CVD oxide deposition. Then the hard mask layer was planarized with stopping with the thickness of thereof being sufficient to cover the top surface of the pad layer SN providing a planar surface above the device including the spaces between and aside from the four islands L1–L4. Thus the isolation spaces IS were filled by the hard mask OX1. Then, above the hard mask layer OX1, a patterning mask (not shown) was formed, as will be understood by those skilled in the art, consisting of stripes running orthogonally (extending from near the top to near the bottom of FIG. 4A). The hard mask OX1 covers the central portions of the original islands L1–L4 in the silicon vertically in the drawing is patterned into the oxide, using a RIE etching process which is selective to silicon nitride including the pad layer SN and the silicon nitride liner SL. The patterning of the silicon oxide of the hard mask OX1 stops on the silicon nitride liner SL that serves as an etch stop layer, thereby avoiding etching into the back oxide BOX.

Formation of Vertical Device Stacks from Islands

FIGS. 5A–5C show the structure of FIGS. 4A–4C after etching the islands L1–L4 to form active areas comprising four vertical stacks ST1–ST4 in the pattern of the hard mask OX1 (which has been removed). The preferred method is to perform an isotropic vertical etch by RIE to form the four vertical stacks ST1–ST4 from the portions of the islands L1–L4 which are shown in FIGS. 4A–4C as being unprotected by the hard mask OXi. Aside from the vertical stacks ST1–ST4, the RIE etching process does not proceed to completion but continues until it has partially lowered the level of the islands L1–L4. The RIE etching process reaches down through the exposed portions of the silicon nitride pad SN (unprotected by the hard mask layer OX1) and underlying portions of the four silicon islands L1–L4 to a level above the surface of the back oxide layer BOX with only a portion of the lowest N+ level of the N+/P/N+ layers as shown in FIG. 5B, and only a portion the lowest P+ level the P+/N/P+ layers remaining to provide a set of buried conductors BC1, BC2, BC3 and BC4 formed from the islands L1–L4, aside from the stacks ST1–ST4. The stack S2 includes the body CBP with the bilateral, vertical sidewalls formed above the top surface of the N+ doped (source S3) region between the conductors BC2. Above the bilateral common body CBP is formed a bilateral N+ doped (drain) region. On each of the common bilateral sidewalls of the bilateral body CBP and the doped N+ (drain) region a sate dielectric layer GD is formed.

Formation of Buried Conductor/Bit Lines

As illustrated by FIG. 5B, which shows a sectional view of stack ST2 in FIG. 5B aside from the vertical stack ST2, the silicon nitride pad layer SN and the upper two N+ doped and P doped regions have been completely etched away and a portion of the lower N+ doped region has been removed also at the location of the exposed portions at the base of the original Si island L2 leaving only the thin layer in the form of buried conductor BC2 beneath a thin High Density Plasma (HDP) oxide layer HD.

Referring to the other three stacks ST1, ST3 and ST4 shown in FIG. 5A, as in the case of the vertical stack ST2, the RIE process ends when the patterned islands L1, L3 and L4 have been etched by RIE to a depth which leaves the bottom N+ doped layer for stacks ST1, leaves the bottom P+ layer doped for stack ST3, and leaves the bottom N+ doped layer for stacks ST4.

Figure 13C:
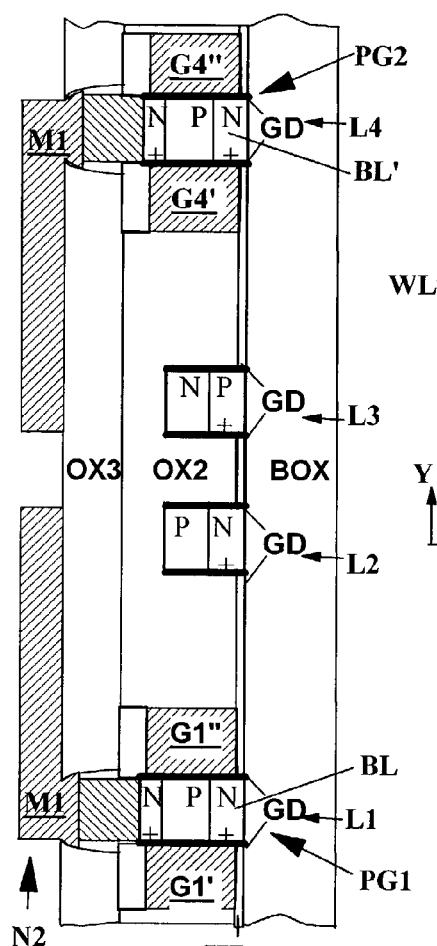
Figure 13A:
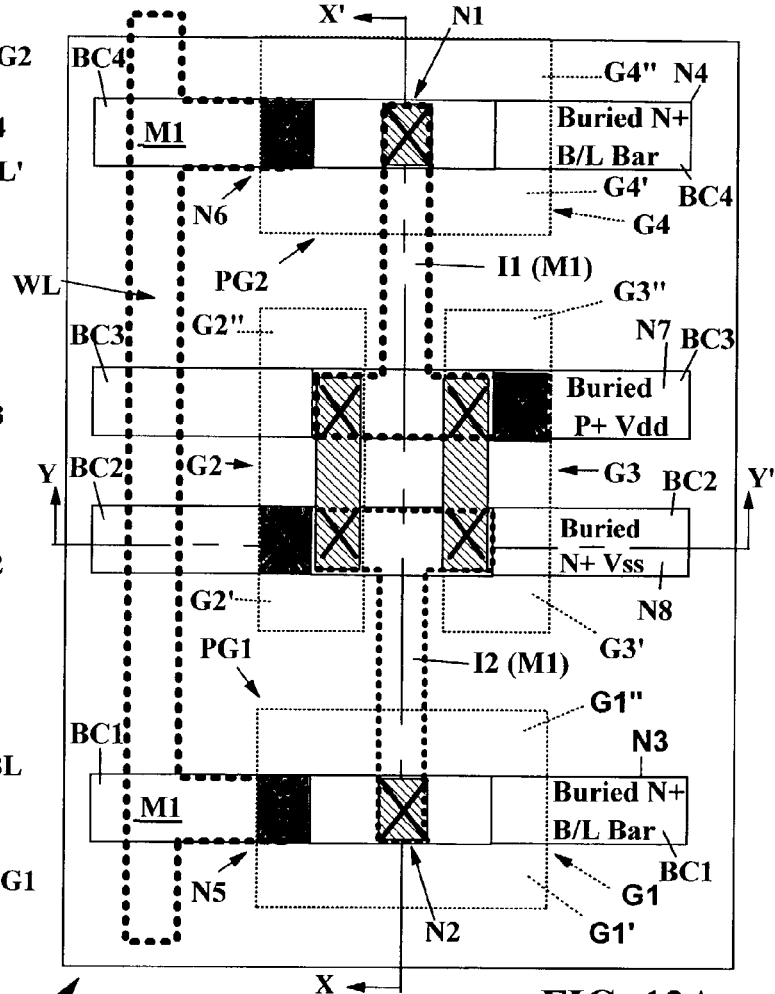

The remaining thickness of the four bottom layers of the four stacks ST1–ST4 is sufficient for them to serve as buried conductors BC1, BC2 BC3 and BC4 at the bottom-most diffusion in each islands L1–L4 from which buried bit line BL, buried bit line BL', buried connection lines Vdd, and buried connection line Vss are formed, as shown in FIG. 13A. In summary, the bottom-most diffusions of the patterned islands L1/L4 are used to form bit lines BL'/BL respectively and the bottom-most diffusions of bit lines L2/L3 are used to provide the Vss and Vdd lines as shown in FIG. 13A, as explained in more detail below.

Second Sacrificial Oxide Formation and Removal

A sacrificial layer is formed by oxidation of exposed surfaced and then the sacrificial layer is removed to remove surface impurities, which preferably leaves the edge of the bottom junctions exposed.

Formation of High Density Plasma Oxide Layer Over Bit Lines

FIGS. 5B and 5C show the High Density Plasma (HDP) oxide layer HD that was formed after removal of any residual sidewall oxide including the sacrificial oxide on the surface of the buried conductor BC2 and the top surface of the stack ST2 in FIG. 5B. In FIG. 5C, the HDP silicon oxide layer HD covers the top surfaces of stacks ST1–ST4 and the exposed surface of the back oxide BOX. The process of formation of the HDP silicon oxide layer HD is then deposited to a thickness sufficient to provide an etch stop layer in subsequent processing. This ensures that gate to bottom source/drain (S/D) overlap on the edges of the vertical MOSFET devices which are formed in subsequent steps will be obtained.

Formation of Gate Dielectric

A vertical gate dielectric GD layer for the vertical FET devices is then formed on the exposed vertical silicon sidewall surfaces of the stacks ST1–ST4 as seen in FIGS. 5B and 5C. For example, the gate dielectric GD may be composed of a dielectric material such as a thermal $SiO_2$ and/or nitrided $SiO_2$.

Note that stack ST2, as seen in FIG. 5B, includes the P doped region CBP which is the shared P doped common body CB with bilateral, vertical sidewalls which will be formed into the pull-down transistors PD1/PD2 shown in FIGS. 10A/10B. Similarly stack 5T3 includes the common body CBN with bilateral, vertical sidewalls which will be shared by the pull-up transistors PU1/PU2.

Deposition of Gate Polysilicon Doped or Undoped

FIGS. 6A–6C show the structure of FIGS. 5A–5C after deposition and planarization of a blanket deposition of gate polysilicon layer GP (to be patterned into gate conductors separated from the common bodies CR and CBN by the sate dielectric GD). As shown in FIGS. 6A–6C, the gate polysilicon layer GP has been planarized to the top surface of the pad layer SN down to the tops of the four stacks ST1–ST4, as seen in FIGS. 6B and 6C. Any HDP oxide HD remaining above the top surface of the pad layer SN is removed by the planarization process leaving the silicon nitride pads SN exposed above the stacks ST1–ST4, as shown in FIG. 6A.

The gate polysilicon layer GP may be doped or undoped. If layer GP is doped, then N+ doping may be employed to form N+ gated NFETs and N+ gated PFETs. If it is desired to dope the gate conductors later in the process, the gate polysilicon layer GP may be implanted following the subsequent gate polysilicon etching process illustrated by FIGS. 7A–7C, and presumably after removal the hard mask HM seen in FIGS. 8A–8C and 9A–9C.

Preliminary Definition of Gate Conductors and Isolation Regions for Inverters

Figures 7A, 7B, 7C:
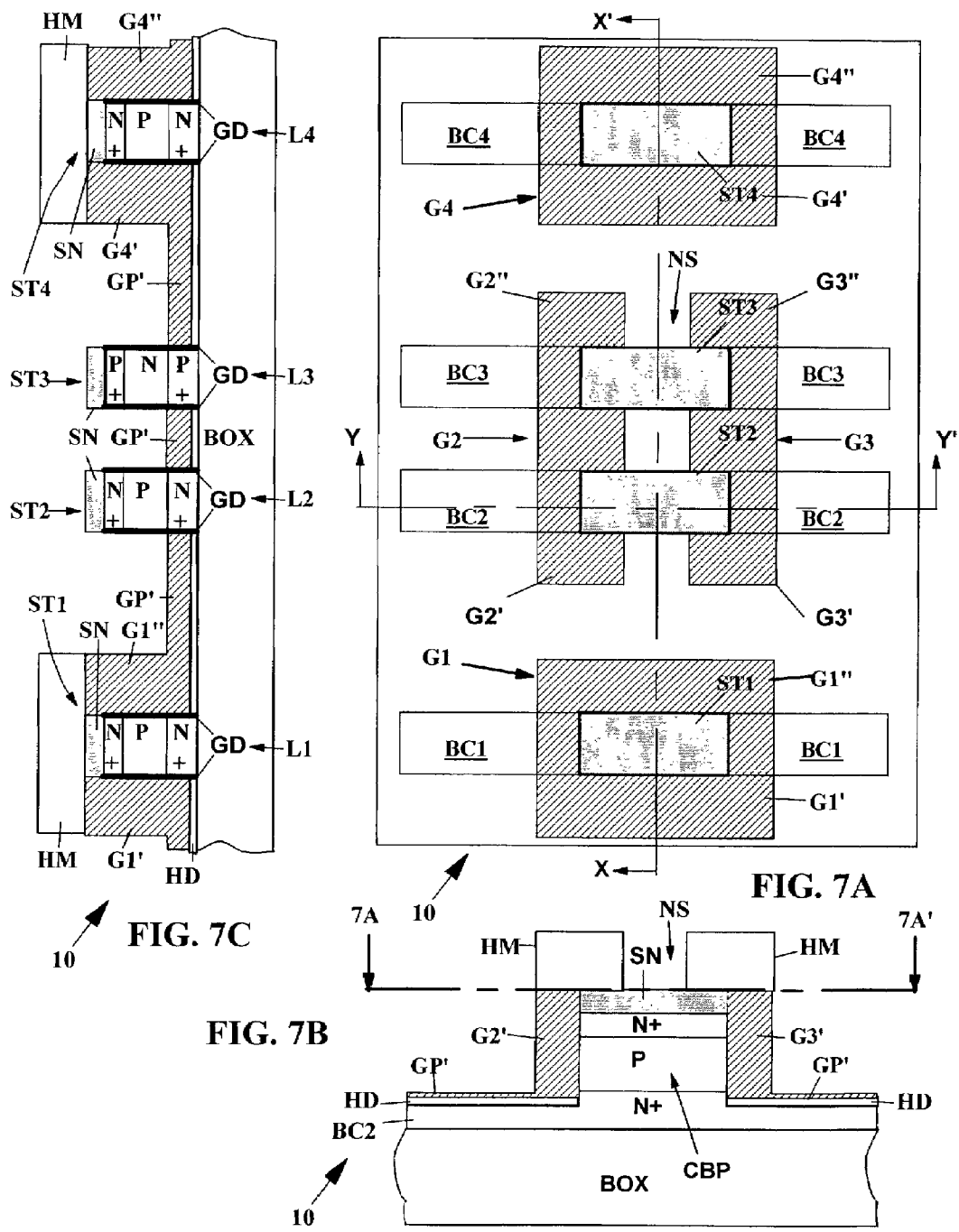

FIGS. 7A–7C show the structure of FIGS. 6A–6C after patterning in which a hard masking material HM (i.e. PR, silicon oxide, $Al_2O_3$) was deposited and patterned with four patterns seen in FIG. 7A which is a section taken along section line 7A–7A' in FIG. 7B, showing the structure below the level of the hard masking material HM. Note that there are two sections of the mask HM which leave the silicon nitride SN exposed above the central portions of vertical stacks ST2 and ST3 through a narrow slot NS therethrough. The lateral portions of the exposed gate polysilicon GP, aside from the hard mask HM, are then etched away by an RIE etching process which is selective to the material of the hard mask HM, silicon nitride pad layer SN and silicon oxide to approximately the depth of the bottom junctions leaving a thickness of gate polysilicon GP' aside from the stacks with a substantial thickness remaining as shown in FIG. 7C and a very thin layer GP' as seen in FIG. 7B above the HDP oxide HD and the extra thickness of the buried conductor BC2. This is the preliminary step in the process of defining the four gate conductors G1–G4 and isolation regions which separate adjacent output node diffusion of the cross-coupled inverters.

In addition, the etching of the gate polysilicon GP has commenced the process of separation of the gate conductors of the cross-coupled inverters which remain connected at this point by the thin, remaining gate polysilicon layer GP'. Thus the etching of the gate polysilicon GP has commenced the process of separation of the gate G2' of the of the pull-up inverter PU1 from gate G3' of the pull-up inverter PU2. Similarly, the etching of the gate polysilicon GP has commenced the process of separation of the gate conductor G2 of the pull-down inverter PD1 from the gate conductor G3 of the pull-down inverter PD1.

Etching Through Pad Nitride to HDP Oxide HD

FIGS. 8A–8C show the structure of FIGS. 7A–7C after the exposed portions of the pad layer SN have been removed by RIE etching selective to the masking material and, preferably, also to silicon oxide and silicon. FIG. 8A shows a sectional view taken along line 8A–8A' in FIG. 8B, below the level of the mask HM. FIG. 8C shows the stacks ST1 and ST4 covered by the hard mask HM. Referring to FIG. 8B, the exposed Si and remaining portion of the vertically extending gate polysilicon GP' is etched by RIE selective to the mask material and silicon oxide. This final RIE removes the residual gate polysilicon layer GP' that remained after the first part of the RIE (FIGS. 7A–7C) down to the surface of HDP oxide HD, which serves as an etch stop layer. This will complete the process of the process of separation of the vertically extending gate G2' of the of the pull-up inverter PU1 from vertically extending gate G3' of pull-up inverter PU2, as well as the simultaneous process of separation of the gate conductor G2 of the vertically extendiniz pull-down inverter PD1 from the gate conductor G3 of vertically extending pull-down inverter PD1.

Separation of Cross-coupled Inverters Stacks

The RIE etching continues through the narrow slot NS, completely through the narrow slot openings NS' left by removal of the exposed portion of the silicon nitride pad SN to etch through the top source region diffusions in stacks ST2 and ST3, into the top portion of the channel regions CBP (shown in FIGS. 1A and 8B) and channel regions CBN (shown in FIG. 1A) of the inverters MOSFET devices to a depth providing assurance that the top source diffusions have been bisected. FIG. 8B shows that the drain region of the pull-up transistor PU1 is separated from the drain region of pull-up transistor PU2 as a result of the RIE etching through narrow slot openings NS'. Similarly, the drain region of the pull-down transistor PD1 is separated from the drain region of pull-down transistor PD2 by the RIE etching through narrow slot openings NS'. In other words, by etching through the top drain diffusions of stacks ST2 and ST3, the opposing output nodes N1/N2 of the cross-coupled inverters have been isolated from each other at the bottom of the narrow slots openings NS'.

Deposition of Planarized Silicon Oxide Forming STI Isolation of Inverters

FIGS. 9A–9C show the structure of FIGS. 8A–8C after the hard mask HM has been removed and a blanket silicon oxide planarization layer OX2 has been deposited by CVD TEOS or HDP and planarized to expose the top surface of the remaining pad layer SN, using Shallow Trench Isolation (STI) formation methods which are well known to one of ordinary skill in the art. The portion of silicon oxide planarization layer OX2 which was deposited into the narrow slots openings NS' narrow slot NS forms a dielectric STI isolation structure STI separating the source regions of the transistors between the adjacent FET devices PD1/PD2 and PU1/PU2 respectively, while maintaining the common body structure as shown in FIG. 1A.

Recess Gate Conductor to Prepare for Contact Formation

FIGS. 10A–10C show the structure of FIGS. 9A–9C after the exposed surface of the polysilicon gate conductors G2'/G3' in FIG. 10B and gate conductors G1 (G1'/G1"), G2 (G2'/G2"), G3 (G3'/G3") and G4 (G4'/G4") in FIG. 10A have been recessed in the planarized surface of silicon oxide layer OX2, using well known methods. As explained below the recesses are filled with sacrificial oxide caps CO. At this point in the process, the remaining portions of silicon nitride pad layer SN overlie the locations of the drains of the six vertical FET devices PG1, PG2, PU1, PU2, PD1, and PD2 in the stacks ST1–ST4. The recesses are formed in an initial step preparing for the formation of drain contacts (in the steps illustrated by FIGS. 12A–12C) aside from the remaining silicon nitride pad layer SN. The recesses reach down to the top level of drain locations of the vertical FET devices PG1, PG2, PU1, PU2, PD1, and PD2 in the stacks ST1–ST4 where a been formed.

Fill Recesses with Silicon Oxide Cap

The sacrificial oxide caps CO are formed in the recesses just formed by depositing a blanket CVD oxide layer oxide which has been planarized to the top surface of the remaining silicon nitride pad layer SN. The oxide cap CO formed over the gate conductors was provided to facilitate the subsequent formation of borderless contacts to the top S/D diffusions of the vertical MOSFETs. The provision of borderless contacts (i.e. contacts BS1–BS4 shown in FIG. 12A and borderless contact BS2 shown in section in FIG. 12 B) allows significant density advantages to be realized.

Form Zero Level Wiring Metallization

FIGS. 11A–11C show the structure of FIGS. 10A–10C after the remaining pad layer SN has been etched away selective to the other materials (i.e. planarizaton silicon oxide layer OX2, Silicon) to expose underlying doped drain regions of the active areas of the FET devices PG1, PG2, PU1, PU2, PD1 and PD2. Any of a variety of etches may be used for the removal of the remaining silicon nitride of the pad layer SN. Removal of the pad layer SN from the structure may be performed by use of HydroFluoric Ethylene Glycol (HFEG). An alternative method of removal of the pad layer SN is etching by RIE.

Then deposits are formed and patterned including a lower level conductive metallization layer M0 (known in the industry as the zero layer, which is composed of a metal such as tungsten(W)) and a silicon nitride cap CN which overlies the lower, zero level level conductive layer M0, as shown above. The zero level metallization layer M0 forms contacts to the doped drain regions of the active areas of the FET devices PG1, PG2, PU1, PU2, PD1 and PD2. As is customary in the art, liners may be used prior to the deposition of the zero level metallization layer M0. This zero level metallization layer M0 forms interconnects between the drains of NFET/PFET devices PU1, PU2, PD1 and PD2 in each inverter, and also forms conductive vias for subsequent contact to the upper (drain) regions of the pass gate transistors PG1/PG2.

Form Spacers Alongside M0 Metallization

Then, a silicon nitride layer is deposited and etched by RIE to form silicon nitride sidewall spacers SP and silicon nitride caps CN as shown to serve as a dielectric providing electrical separation between the zero level metallization layer M0 and the metallic contact studs BS1–BS4 as shown in FIGS. 12A and 12B.

Form Borderless Studs as Contacts to Gate Electrodes

FIGS. 12A–12C show the structure of FIGS. 11A–11C after a third silicon oxide layer OX3 was deposited and planarized to the top surface of the silicon nitride cap CN formed over the zero level metallization layer M0. Vias are opened in the third silicon oxide layer OX3, selective to leave the silicon nitride SiN sidewall spacers SP and silicon nitride caps CN in place while at the same time exposing the top surfaces of the gate polysilicon of the four gate electrodes G1, G2, G3 and G4. The overlying metallization layer M1 is deposited and planarized to the top surface of the zero level metallization layer M0 silicon nitride caps CN to form metallic contact studs BS1–BS4 reaching down to the four gate electrodes G1, G2, G3 and G4. The studs BS1–BS4 are borderless to the zero wiring level metallization layer M0 and will be used subsequently to contact an "first" wiring level layer referred to herein as the overlying metallization layer M1.

Form First Level Wiring Metallization

Figure 13B:
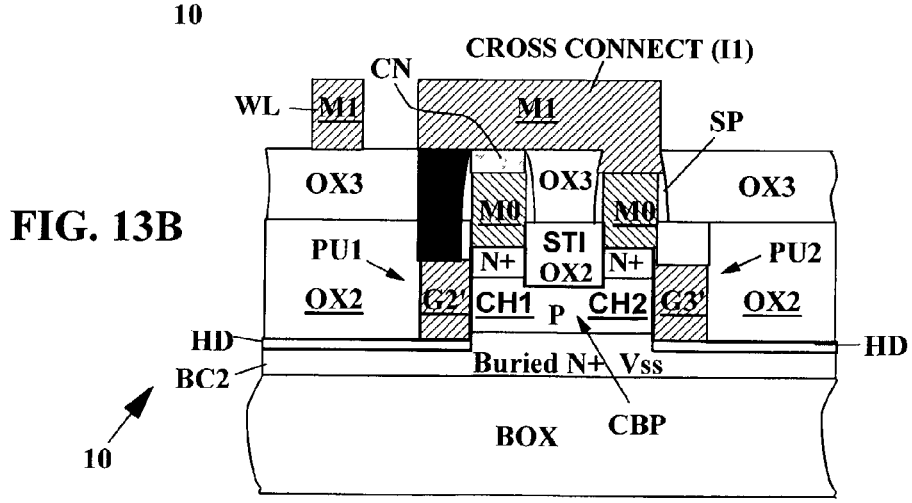

FIGS. 13A–13C show the structure of FIGS. 12A–12C after first level wiring overlying metallization layer M1 was deposited and defined to form the "first" level wiring. The overlying metallization layer M1 forms the interconnection lines I1/I2 between pairs of cross-coupled inverters PU1/PD1 and PU2/PD2, a connection between cross-coupled output node N1 to the drain of pass gate device PG2, a connection of node N2 to the drain of pass gate device PG1, and connections of the gates of pass gate G1 and G2 to the wordline WL.

To reduce buss resistance, the buried diffused lines (bitline, bitline bar, Vdd, Vss) may be periodically strapped with a higher wiring level by breaking the array. Standard processing to completion of the chip follows with the formation of upper interlayer dielectrics, vias and wiring levels.

ALTERNATIVE FEATURES

While the pass gate transistors in the above described embodiment are shown as being vertical transistors, the pass gate transistors can be either planar or vertical, as will be well understood by those skilled in the art. In addition, there could be two pairs of pass gate transistors forming a well-known dual-port SRAM device.

The gate electrode can be made formed of a heavily doped polycrystalline semiconductor or in the alternative the gate electrode may be formed entirely or partially of metallic conductor The semiconductor may be selected from the group consisting of silicon (Si), silicon germanium (SiGe), or silicon germanium carbide (SiGeC).

SUMMARY

An SRAM cell design using all vertical MOSFET devices with surrounding (transfer) gates to achieve high-performance, low-power and small chip size simultaneously has been taught. Borderless contacts are applied to power lines, wordlines and bitlines. Further size reduction can be achieved by using sub-lithographic sidewall spacer gates. The compact vertical cross-coupled layout can also be applied to circuits which would normally use conventional cross-coupled devices such as in sense amplifiers, differential amplifiers, etc. The pair of pull-up transistors and the pair of pull-down transistors in the inverter share a common body region CBP which provides a common Vt value therefor, thereby overcoming the Vt mismatch problem.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a vertical Static Random Access Memory (SRAM) cell device comprising the steps as follows:

forming pass gate FET transistors (PG1,PG2), forming a pair of vertical pull-down FET transistors (PD1,PD2) with a first, common body (CBN) and a first common source region (S2), forming a pair of vertical pull-up FET transistors (PU1, PU2) with a second, common body (CBP) and a second common source region (S3), and connecting said FET transistors in an SRAM cell circuit.

2. A method of forming a vertical Static Random Access Memory (SRAM) cell device comprising the steps as follows:

forming pass gate FET transistors (PG1,PG2), forming a pair of vertical pull-down FET transistors (PD1,PD2) with a first, common body (CBN) and a first common source region (S2), forming a pair of vertical pull-up FET transistors (PU1, PU2) with a second, common body (CBP) and a second common source region (S3), connecting said FET transistors in an SRAM cell circuit, forming a common diffusion for an uppermost diffusion for drain regions of an FET, and then etching said diffusion to form a recess thereby forming isolated diffusions comprising isolated drain regions above a said common body.

3. A method of forming a vertical Static Random Access Memory (SRAM) cell device comprising the steps as follows:

forming pass gate FET transistors (PG1,PG2), forming a pair of vertical pull-down FET transistors (PD1,PD2) with a first, common body (CBN) and a first common source region (S2), forming a pair of vertical pull-up FET transistors (PU1, PU2) with a second, common body (CBP) and a second common source region (S3), connecting said FET transistors in an SRAM cell circuit, forming an uppermost common diffusion for an uppermost diffusion for drain regions of an FET, etching said uppermost common diffusion to form a recess above each of the first common body and the second common body thereby forming isolated diffusions comprising isolated drain regions above each of said first common body and said second common body, and filling each said recess with a dielectric material.

4. The method of claim 3 wherein the pass gate FET transistors are selected from the group consisting of planar and vertical transistors.

5. The method of claim 3 wherein the SRAM device includes dual pairs of pass gate FET transistors forming a dual-port SRAM cell.

6. The method of claim 3 including the step of connecting the FET transistors with a sublithographic horderless contact structure formed between the upper diffusion area of non-planar transistor and a zero (M0) metallization layer.

7. The method of claim 3 including the step of connecting the FET transistors with a sublithographic borderless contact structure formed between the gate electrode of non-planar transistor and a zero (M0) metallization layer.

8. The method of claim 3 including the step of connecting the FET transistors with a sublithographic borderless contact structure formed between the gate electrode of a non-planar transistor and a second metallization layer.

9. The method of claim 3 wherein common gate electrodes interconnect pull-down and pull-up vertical FETs.

10. The method of claim 3 wherein the gate electrode is made of a heavily doped polycrystalline semiconductor material selected from the group consisting of Si, SiGe, and SiGeC.

11. The method of claim 1 including forming the first common body region (CBN) above the first common source region (S2) and forming the second common body region (CBP) above the second common source region (S3).

12. The method of claim 11 including forming a first common drain region (D2,D3) above the first common body region (CBN) and forming a second common drain region (D4,D5) above the the second common body region(CBP).

13. The method of claim 12 including bisecting the first common drain region (D2,D3) into first separate drain regions (D2,D3) and forming a first dielectric isolation region (STI) between the first separate drain regions (D2, D3) and bisecting the second common drain region (D4,D5) into second separate drain regions (D4,D5) and forming a second dielectric isolation region (STI) between the first separate drain regions (D2,D3).

14. The method of claim 13 including forming the vertical pull-down FET transistors (PD1,PD2) with the first common source region (S2), the first common body region(CBN) and the first separate drain regions (D2,D3) and forming the vertical pull-up FET transistors (PU1,PU2) with the second common source region (53), the second common body region(CBP) and the second separate drain regions (D4,D5).

15. The method of claim 14 including connecting the FET transistors in an SRAM cell circuit.

16. The method of claim 1 including:

forming the first common body region (CBN) above the first common source region (S2) and forming the second common body region (CBP) above the second common source region (S3), forming a first separate drain regions (D2,D3) above the first common body region (CBN) and forming a second separate drain regions (D4,D5) above the the second common body region(CBP), and forming the vertical pull-down FET transistors (PD1, PD2) with the first common source region (S2), the first common body region(CBN) and the first separate drain regions (D2,D3) and forming the vertical pull-up PET transistors (PU1,PU2) with the second common source region (53), the second common body region(CBP) and the second separate drain regions (D4, D5).

17. The method of claim 1 including:

forming a set of doped pull-down strata for the vertical pull-down transistors (PD1,PD2), comprising a pull-down lower stratum for the first common source region (S2), a pull-down body stratum for common body (CBN), and a pull-down upper stratum for drain regions (D2/D3), the upper pull-down stratum and the pull-down lower stratum for the vertical pull-down FET transistors (PD1, PD2), having opposite types of dopant from the pull-down body stratum for common body (CBN), forming a set of doped pull-up strata for the vertical pull-up FET transistors (PU1,PU2), comprising a lower pull-up stratum for the second common source region (S3), a pull-up body stratum for common body (CBP), and a pull-up upper stratum for drain regions (D4/D5), the pull-up upper stratum and the pull-up lower stratum for the vertical pull-up FET transistors (PU1,PU2), having opposite types of dopant from the pull-up body stratum for common body (CBP), etching to form a pull-down isolation space bisecting the upper pull-down stratum to form pull-down drain regions (D2/D3) for the pull-down FET transistors (PD1,PD2), with the pull-down isolation space reaching down to the pull-down body stratum, etching to form a pull-up isolation space bisecting the upper pull-up stratum to form pull-up drain regions (D4/D5) for the vertical pull-up FET transistors(PU1, PU2), with the pull-up isolation space reaching down to the pull-up body stratum.

18. The method of claim 17 including filling the pull-down isolation space and the pull-up isolation space with an isolation dielectric.

19. The method of claim 17 wherein the pass gate FET transistors are selected from the group consisting of planar and vertical transistors.

20. The method of claim 17 wherein the SRAM device includes dual pairs of pass gate FET transistors forming a dual-port SRAM cell.

* * * * *